(12) United States Patent
Satoh

(10) Patent No.: US 11,139,019 B1
(45) Date of Patent: Oct. 5, 2021

(54) APPARATUSES AND METHODS FOR DELAY CONTROL ERROR PROTECTION

(71) Applicant: Micron Technology, Inc., Boise, ID (US)

(72) Inventor: Yasuo Satoh, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/177,025

(22) Filed: Feb. 16, 2021

(51) Int. Cl.
| | | |
|---|---|---|
| *H03K 5/01* | (2006.01) | |
| *G11C 11/4076* | (2006.01) | |
| *H03K 19/20* | (2006.01) | |
| *H03K 3/037* | (2006.01) | |
| *H03L 7/081* | (2006.01) | |
| *G11C 19/28* | (2006.01) | |
| *H03K 5/00* | (2006.01) | |

(52) U.S. Cl.
CPC ........ *G11C 11/4076* (2013.01); *G11C 19/287* (2013.01); *H03K 3/037* (2013.01); *H03K 5/01* (2013.01); *H03K 19/20* (2013.01); *H03L 7/0818* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 8,437,726 | B2 * | 5/2013 | Kwon | H03K 17/00 455/330 |
| 2012/0268181 | A1 * | 10/2012 | Fujimaki | H03L 7/10 327/158 |
| 2017/0237442 | A1 * | 8/2017 | Kim | H03L 7/091 327/142 |

* cited by examiner

*Primary Examiner* — Cassandra F Cox
(74) *Attorney, Agent, or Firm* — Dorsey & Whitney LLP

(57) ABSTRACT

Apparatuses and methods for correcting a code used for delay adjustment are disclosed. An example method includes providing a bit of a thermometer code responsive, at least, to a shift direction signal; and adjusting an amount of a delay responsive to the thermometer code. Providing the bit comprises correcting the bit using one or more adjacent bits on one side of the bit in the thermometer code and one or more adjacent bits on another side of the bit in the thermometer code.

25 Claims, 14 Drawing Sheets

0001<u>0</u>011 → 0000<u>0</u>011          ········ (Conversion 41)

001<u>0</u>1111 → 001<u>1</u>1111          ········ (Conversion 42)

011<u>0</u>1111 → 011<u>1</u>1111          ········ (Conversion 43)

0101<u>0</u>011 → 010<u>0</u>0011 → 0<u>0</u>000011   ········ (Conversion 44)

0101<u>0</u>111 → 01<u>0</u>11111 → 01<u>1</u>11111   ········ (Conversion 45)

*FIG. 4*

00010011 → 00000011 ········ (Conversion 101)

00101111 → 00111111 ········ (Conversion 102)

01101111 → 01111111 ········ (Conversion 103)

01010011 → 01000011 → 00000011 ········ (Conversion 104)

01010111 → 01011111 → 01111111 ········ (Conversion 105)

00110011 → 00111011 → 00111111 ········ (Conversion 106)

FIG. 10

APPARATUSES AND METHODS FOR DELAY CONTROL ERROR PROTECTION

BACKGROUND

High data reliability, high speed memory access, lower power consumption and reduced chip size are features that are demanded from semiconductor memory. To achieve higher memory access speed, operational timing in the semiconductor memory is adjusted using a clock signal as a reference signal.

When an external clock signal enters into a circuit, the clock phase of internal clock signals based on the external clock signal may be delayed because of the inherent delay of the components of the circuit. At high operating speeds, distortions in a clock signal duty cycle may adversely affect the functioning of the circuit. To accommodate these delays and distorting effects, a clock path may include a delay circuit. The clock phase may be adjusted to match the phase of the external clock using a delay circuit such as a delay locked loop ("DLL"). Conventional DLLs may include a coarse delay line that provides a coarser resolution of delay adjustment and a fine delay line that provides a finer resolution of delay adjustment. The coarse delay line includes a shill register circuit that provides a thermometer code which represents delay adjustment. In a thermometer code Q<0:N>, an integer from zero to N may be represented by rightmost bits Q<k:N> as "1" and the other bits, if any remain, as "0" where k is another integer from zero to N. Recently, soft errors, such as bit flips in the thermometer code due to neutron strikes caused by cosmic rays, have been observed. As a countermeasure, a simple thermometer protection flipping a bit representing "0" on a right side of a bit representing "1" has been implemented. However, this type of countermeasure is vulnerable when the bit representing "1" is an error. In order to mitigate bit flips, dual interlocked storage cell latches (DICE latches) have been introduced. However, the DICE latches have disadvantages of low speed and weak robustness for meta-stability. Because operations in a coarse delay line is time sensitive, the DICE latches with low speed is not suitable for the countermeasure in the coarse delay line. Thus, another countermeasure that effectively corrects multiple bit flips at a high speed suitable for the coarse delay line is desired.

BRIEF DESCRIPTION OF THE DRAWINGS

FIG. 4 is a diagram of correction operations of a thermometer code in a DLL circuit in accordance with an embodiment of the present disclosure.

FIG. 10 is a diagram of correction operations of a thermometer code in a DLL circuit in accordance with an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
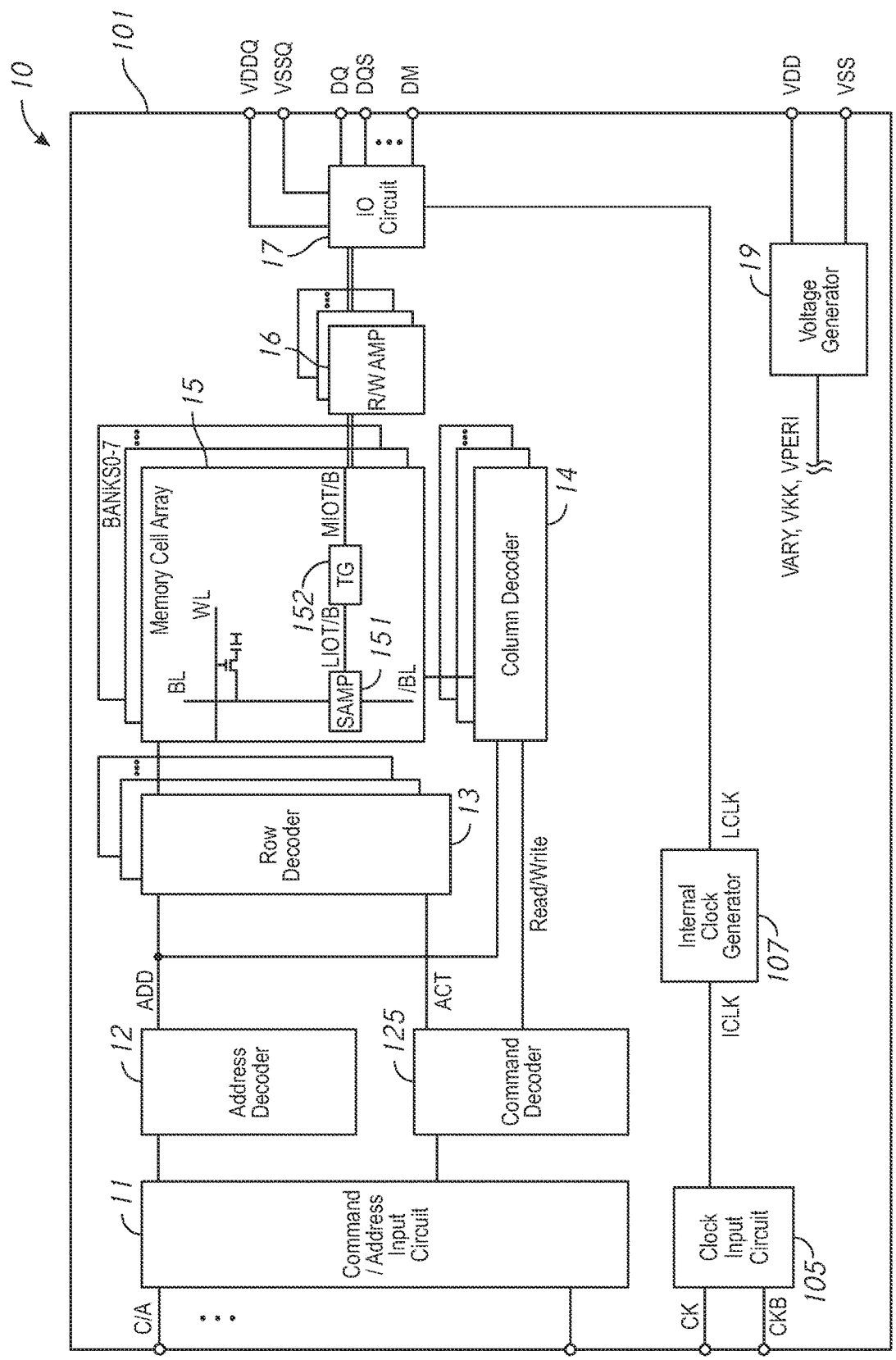
FIG. 1 is a schematic block diagram of a semiconductor memory device, in accordance with an embodiment of the present disclosure.

FIG. 1 is a schematic block diagram of a chip 101 of a semiconductor memory device 10, in accordance with an embodiment of the present disclosure. In some embodiments, the semiconductor memory device 10 is an apparatus that may include a plurality of chips, including the chip 101. The chip 101 may include a clock input circuit 105, an internal clock generator 107, a command and address input circuit 11, an address decoder 12, a command decoder 125, a plurality of row decoders 13, a memory cell array 15 including sense amplifiers 151 and transfer gates 152, a plurality of column decoders 14, a plurality of read/write amplifiers 16, an input/output (JO) circuit 17, and a voltage generator circuit 19. The semiconductor memory device 10 may include a plurality of external terminals including address and command terminals coupled to command/address buses, clock terminals CK and/CK, data terminals DQ, a data strobe terminal DQS, and a data mask terminal DM and power supply terminals VDD, VSS, VDDQ, and VSSQ.

The memory cell array 15 includes a plurality of banks (e.g., Banks0-7), each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 13 and the selection of the bit line BL is performed by a corresponding column decoder 14.

The plurality of sense amplifiers SAMP 151 are located for their corresponding bit lines BL and coupled to at least one respective local I/O line (e.g., LOT/B) further coupled to a respective one of at least two main I/O line pairs (e.g., MIOT/B), via transfer gates TG 152, which function as switches.

The command and address input circuit 11 may receive an address signal and a bank address signal from outside at the command/address terminals via the command/address bus (C/A) and transmit the address signal and the bank address signal to the address decoder 12. The address decoder 12 may decode the address signal received from the command and address input circuit 11 and provide address signals ADD. The address signals ADD may include a row address signal to the row decoder 13, and a column address signal to the column decoder 14. The address decoder 12 may also receive the bank address signal and provide the bank address signal to the row decoder 13 and the column decoder 14.

The command and address input circuit 11 may receive a command signal from outside at the command/address terminals via the command/address buses and provide the command signal to the command decoder 125. The command decoder 125 may decode the command signal and provide generate various internal command signals. For example, the internal command signals may include a row command signal to select a word line, a column command signal, such as a read command or a write command, to select a bit line.

Accordingly, when an activation command is issued and a row address is timely, supplied with the activation command, and a read command is issued and a column address is timely supplied with the read command, read data is read from a memory cell in the memory cell array 15 designated by the row address and the column address. The read/write amplifiers 16 may receive the read data and provide the read data to the IO circuit 17. The IO circuit 17 may provide the read data to outside via the data terminals DQ together with a data strobe signal at the data strobe terminal DQS and a data mask signal at the data mask terminal DM. Similarly, when the activation command is issued and a row address is timely, supplied with the activation command, and a write command is issued and a column address is timely supplied with the write command, the circuit 17 may receive write data at the data terminals DQ, DQS, DM, together with a data strobe signal at DQS and a data mask signal at DM and provide the write data via the read/write: amplifiers 16 to the memory cell array 15. Thus, the write data may be written in the memory cell designated by the row address and the column address.

Turning to the explanation of the external terminals included in the semiconductor device 10, the clock terminals CK and CKB may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK. In some embodiments, a DLL circuit may be used as the internal clock generator 107. The internal clock generator 107 may provide the phase controlled internal clock signal LCLK to the IO circuit 17. The IO circuit 17 may use the phase controlled internal clock signal LCLK as a timing signal for determining an output timing of read data.

The power supply terminals may receive power supply voltages VDD and VSS. These power supply voltages VDD and VSS may be supplied to a voltage generator circuit 19. The voltage generator circuit 19 may generate various internal voltages, VKK, VARY, VPERI, and the like based on the power supply voltages VDD and VSS. The internal voltage VKK may be used in the row decoder 13, the internal voltage VARY may be used in the sense amplifiers 151 included in the memory cell array 15, and the internal voltage VPERI is used in many other circuit blocks. The power supply terminals may also receive power supply voltages VDDQ and VSSQ. The IO circuit 17 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the 10 circuit 17.

Figure 2A:
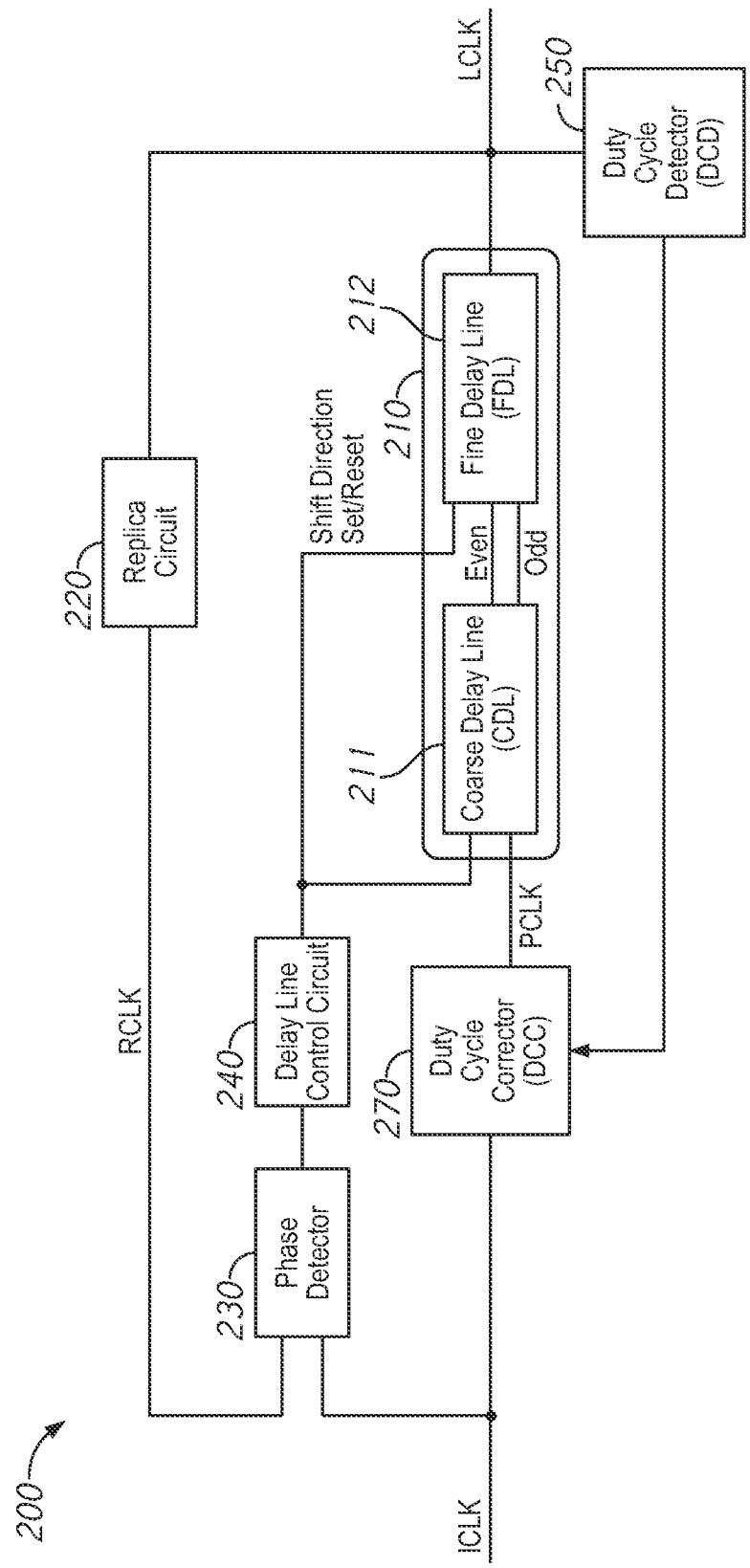
FIG. 2A is a block diagram of a DLL circuit in a semiconductor memory device in accordance with an embodiment of the present disclosure.

FIG. 2A is a block diagram of a DLL circuit 200, in accordance with an embodiment of the present disclosure. The DLL circuit 200 may be the DLL circuit used as the internal clock generator 107. The DLL circuit 200 may include a delay line 210 that may generate an internal clock signal LCLK by delaying an internal clock signal PCLK. Here, the internal clock signal PCLK is an output signal of a duty cycle corrector (DCC) 270. The DCC 270 may receive an internal clock signal ICLK from the clock input circuit 105 upon receipt of external clock signals CK and CKB and may further receive duty cycle information from a duty cycle detector 250 that detects the duty cycle of an internal clock LCLK and corrects the duty cycle of the internal clock signal LCLK and provides the internal clock signal PCLK. The delay line 210 includes a coarse delay line (CDL) 211 having a low resolution with a coarse (e.g., large) step size of delay adjustment and a fine delay line (FDL) 212 having a high resolution with a fine (e.g., small) step size of delay adjustment, in a series connection. An output signal of the delay line 210 is provided as the internal clock LCLK. The internal clock may be provided, for example, to the IO circuit 17. The internal clock signal LCLK can be used as a reference signal for controlling timings of providing read data DQ and a data strobe signal DQS in FIG. 1.

Figure 2B:
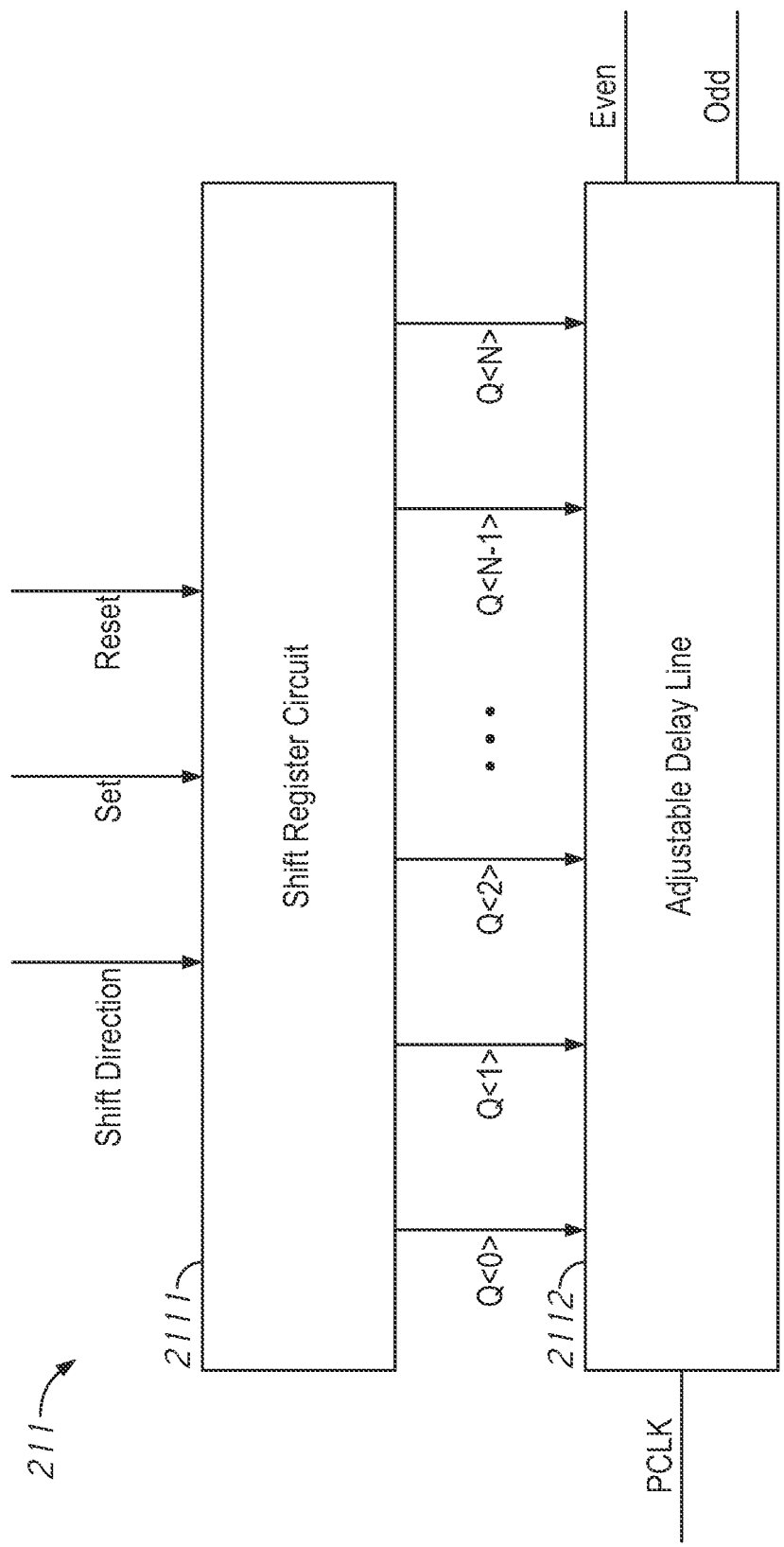
FIG. 2B is a block diagram of a CDL in the DLL circuit in accordance with an embodiment of the present disclosure.

The output signal of the delay line 210 may be also supplied to a replica circuit 220. The replica circuit 220 may represent a delay equivalent to a sum of delays on a clock path, including but not limited to, a delay of the IO circuit 17 and a delay of the clock input circuit 105. An output signal of the replica circuit 220 may be provided as a replica clock signal RCLK to a phase detector 230. The internal clock signal ICLK from the clock input circuit 105 may also be provided to the phase detector 230. In a semiconductor device with high speed memory access, the read data to be provided on the data terminals DQ and the data strobe signal at the data strobe terminal DQS need to be in synchronization with the external clock signals CK and CKB. The phase detector 230 may detect a phase difference between the replica clock signal RCLK and the internal clock signal ICLK reflecting the external clock signals CK and CKB, and provide a phase shift signal to a delay line control circuit 240. Responsive to the phase shift signal, the delay line control circuit 240 may provide control signals, including a shift direction control signal, a set signal and a reset signal to the CDL 211, to control a delay of the delay line 210. When a phase of the replica clock signal RCLK is lagging a phase of the internal clock signal ICLK, the delay by the delay line 210 may be decreased. On the other hand, if the phase of the replica clock signal RCLK is leading of the phase of the internal clock signal ICLK, the delay in the delay line 210 may be increased. The delay of the delay line 210 such as the CDL 211 and the FDL 212 may be controlled to lock the phase of the replica clock signal RCLK in synchronization with the phase of the internal clock signal ICLK. FIG. 2B is a block diagram of the CDL 211 in the circuit 200 in accordance with an embodiment of the present disclosure. The CDL 211 may include a shift register circuit 2111 and an adjustable delay line 2112. The shift register circuit 2111 may receive the shift direction control signal, the set signal and the reset signal from the delay line control circuit 240. The shift register circuit 2111 may provide a coarse delay control code Q<0:N> to the adjustable delay line 2112. The coarse delay control code Q<0:N> may be a thermometer code. The adjustable delay line 2112 may include a plurality of delay units (not shown) coupled in series. Each delay unit of the plurality of delay units may receive each corresponding bit of the coarse delay control code and may provide even/odd input clock signals to the FDL 212. Here, the odd clock signal may be provided from a selected odd numbered one of the plurality of delay units and the even clock signal may be provided from a selected even numbered one of the plurality of delay units. The odd and even numbers are adjacent numbers. The even/odd input clock signals may have a phase difference relative to one another. The FDL 212 may further receive sets of fine control signals and clock signals responsive to the phase shift. The FDL 212 may provide the locked clock signal as the internal clock signal LCLK, responsive to the even/odd input clock signals and the fine control signals. Thus, the read data and the data strobe signal DOS may be in synchronization with the external clock signals CK and CKB.

Figure 3:
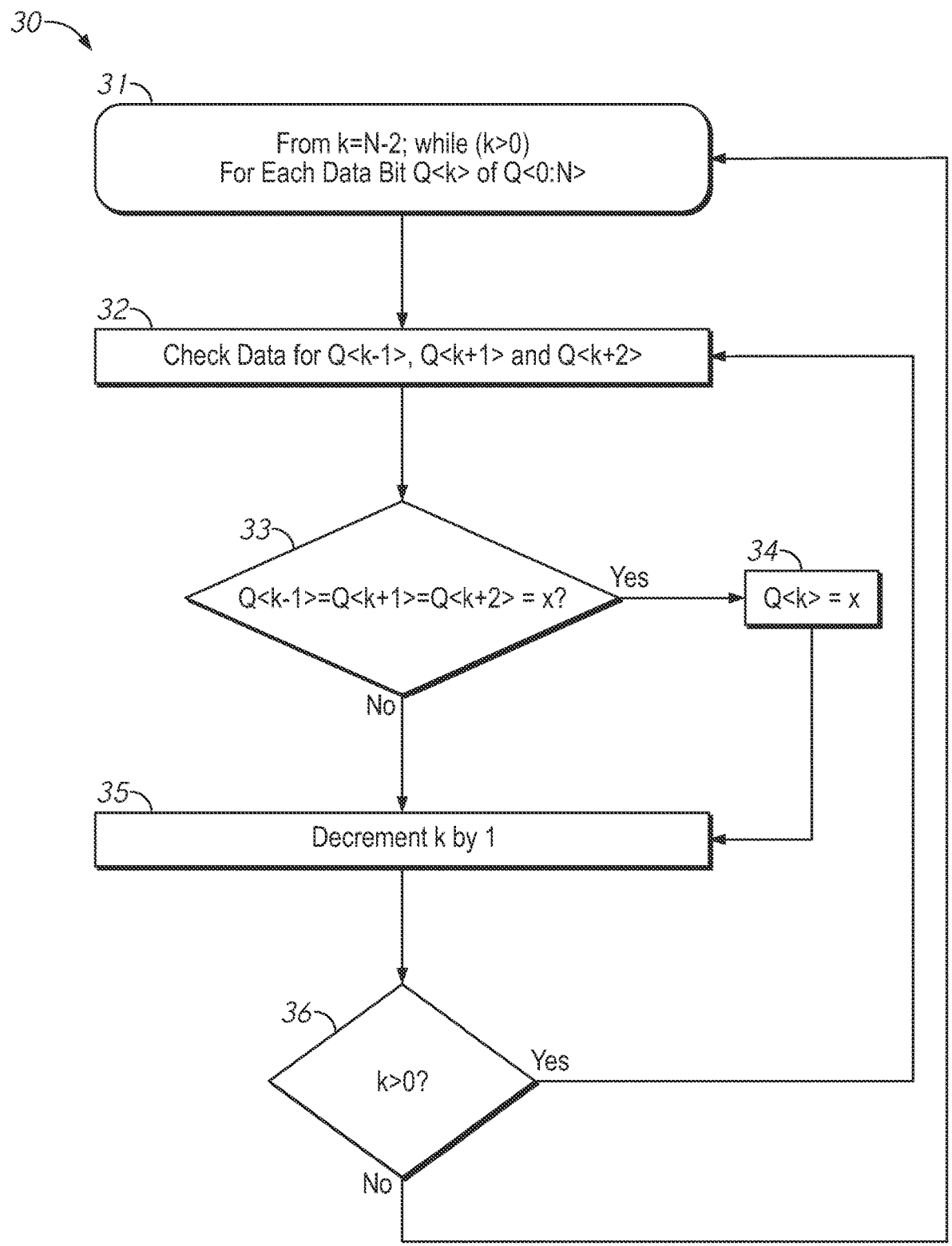
FIG. 3 is a flow diagram of a correction operation of a thermometer code in accordance with an embodiment of the present disclosure.

FIG. 3 is a flow diagram of a correction operation 30 of a thermometer code in accordance with an embodiment of the present disclosure. In some embodiments, the correction operation 30 of the thermometer code Q<0:N> (e.g., N is a natural number) may be performed in the shift register circuit 2111 of FIG. 2B. The thermometer code Q<0:N> may represent a natural number, where the thermometer code includes one or more rightmost bits having "1" and zero or more leftmost bits having "0." The correction operation 30 in FIG. 3 may use one or more adjacent more significant bits relative to a bit Q<k> (e.g., on one side of the bit Q<k>) in the thermometer code and one or more less significant adjacent bits relative to the bit Q<k> (e.g., on another side of the bit Q<k>) in the thermometer code in correcting a bit value of the bit Q<k> of the thermometer code Q<0:N>, where k is a natural number less than N. In some embodiments, the correction operation 30 in FIG. 3 may use two adjacent more significant bits Q<k+2> and Q<k+1> on one side of the bit Q<k> in the thermometer code and one adjacent less significant bit Q<k−1> on the other side of the bit Q<k>, if the three adjacent bits Q<k+2>, Q<k+1> and Q<k−1> are available. If the three adjacent bits Q<k+2>, Q<k+1> and Q<k−1> have an identical value (e.g., "1" or "0"), the identical value may be set as a corrected bit value to the bit Q<k>. In some embodiments, the correction operation 30 in FIG. 3 weighs one or more adjacent more significant bits in the thermometer code more than one or more adjacent less significant bits in the thermometer code.

For example, the correction operation 30 in FIG. 3 may use two adjacent bits Q<k+1> and Q<k+2> on a right side of Q<k>, thus more significant bits, and an adjacent bit Q<k−1> on a left side of Q<k>, thus less significant bit, in the thermometer code Q<0:N> in correcting the bit Q<k>. Q<k−1> and Q<k+1> may be immediately adjacent bits to the bit Q<k>. In an operation block 31, for each bit Q<k> of the thermometer code Q<0:N> and for each k that is less than (N−1), a correction operation may be initiated. In an operation block 32, the adjacent bits, such as Q<k−1>, Q<k+1> and Q<k+2> may be received and checked. If the three adjacent bits Q<k−1>, Q<k+1> and Q<k+2> have an identical value x (e.g., "1" or "0") in an operation block 33 ("Yes"), the bit Q<k> may be set to the identical value x in an operation block 34. Then the operation proceeds to an operation block 35 from block 34. If any of the three adjacent bits Q<k−1>, Q<k+1> and Q<k+2> have a different value in the operation block 33 ("No"), then the operation proceeds to the operation block 35. In the operation block 35, the natural number k is decremented by one and the operation proceeds to an operation block 36. If the natural number k is not equal to zero, the operation proceeds to the operation block 32 for the next lower bit of the thermometer code Q<0:N>. In the present example, the next lower bit may be Q<k'>, and the three adjacent bits are Q<k'−1> and Q<k'+2>. In operation block 32, the three adjacent bits Q<k'−1>, Q<k'+1> and Q<k'+2> are checked, and if three adjacent bits Q<k'−1>, Q<k'+1> and Q<k'+2> have an identical value in the operation block 33, then the bit Q<k'> is set to the identical value in the operation block 34. This recursive process repeats until the natural number k is equal to the zero in the operation block 36. Once the natural number k becomes equal to zero in the operation block 36, the correction operation for Q<0:N> has been completed and a new correction operation for next thermometer code Q<0:N> may be performed. This iteration of correction operations continues until Q<0:N> becomes a thermometer code without a bit sequence "10" in the thermometer code. In some embodiments described above, the correction operation 30 performs bit corrections from a higher bit to a lower bit (e.g., from Q<N−2> to Q<1>). In other embodiments, a similar correction operation may be performed from a lower bit to a higher bit (e.g., from Q1> to Q<N−2>).

FIG. 4 is a diagram of correction operations of a thermometer code in a DLL circuit in accordance with an embodiment of the present disclosure. In some embodiments, the correction operation 30 of a thermometer code Q<0:N> (e.g., N is a natural number) may be used and a natural number N may be seven. Q<0> is a leftmost bit and Q<N> is a rightmost bit in examples of the thermometer code of FIG. 4.

In a conversion 41, "1" of Q<3> in the thermometer code Q<0:N> may be converted into "0." When the natural number k is equal to 3, the adjacent bits Q<2>, Q<4> and Q<5> to the bit Q<3> are checked in the operation block 32 of FIG. 3. Because Q<2>, Q<4> and Q<5> are all "0" in the operation block 33, Q<3> may be set to "0" in the operation block 34, regardless of the current value of Q<3>. In another conversion 42, "0" of Q<3> may be converted into "1." When the natural number k is equal to 3, the adjacent bits Q<2>, Q<4> and Q<5> to the bit Q<3> are checked in the operation block 32 of FIG. 3. Because the adjacent bits Q<2>, Q<4> and Q<5> are all "1" in the operation block 33, Q<3> may be set to "1" in the operation block 34, regardless of the current value of Q<3>. In the conversion 42 "1" of Q<2> of the conversion 42 is maintained without setting to "0" because Q<4> is "1." In another conversion 43, similar to the conversion 42, "0" of Q<3> may be converted into "1" regardless of the current value of Q<3> because the adjacent bits Q<2>, Q<4> and Q<5> are all "1."

In another conversion 44, "1" of Q<3> may be converted into "0" in a correction operation of the operation block 31. When the natural number k is equal to 3, the adjacent bits Q<2>, Q<4> and Q<5> are checked in the operation block 32 of FIG. 3. Because the adjacent bits Q<2>, Q<4> and Q<5> are all "0" in the operation block 33, Q<3> may be set to "0" in the operation block 34, regardless of the current value of Q<3>. The correction operation continues and "1" of Q<1> may be converted into "0." When the natural number k is equal to 1, the adjacent bits Q<0>, Q<2> and Q<3> are checked in the operation block 32 of FIG. 3. Because the adjacent bits Q<0>, Q<2> and Q<3> are all "0" in the operation block 33, Q<1> may be set to "0" in the operation block 34, regardless of the current value of Q<1>.

In another conversion 45, "0" of Q<4> may be converted into "1" in a correction operation of the operation block 31. When the natural number k is equal to 4, the adjacent bits Q<3>, Q<5> and Q<6> are checked in the operation block 32 of FIG. 3. Because the adjacent bits Q<3>,Q<5> and Q<6> are all "1" in the operation block 33, Q<4> may be set to "1" in the operation block 34, regardless of the current value of Q<4>. The correction operation continues and, "0" of Q<2> may be converted into "1," When the natural number k is equal to 2, the adjacent bits Q<1>, Q<3> and Q<4> are checked in the operation block 32 of FIG. 3. Because the adjacent bits Q<1>, Q<3> and Q<4> are all "1" in the operation block 33, Q<2> may be set to "1" in the operation block 34, regardless of the current value of Q<2>. As shown in the conversions 44 and 45, the correction operations are performed in iteration until Q<0:N> becomes a thermometer code without a bit sequence "10."

Figure 5:
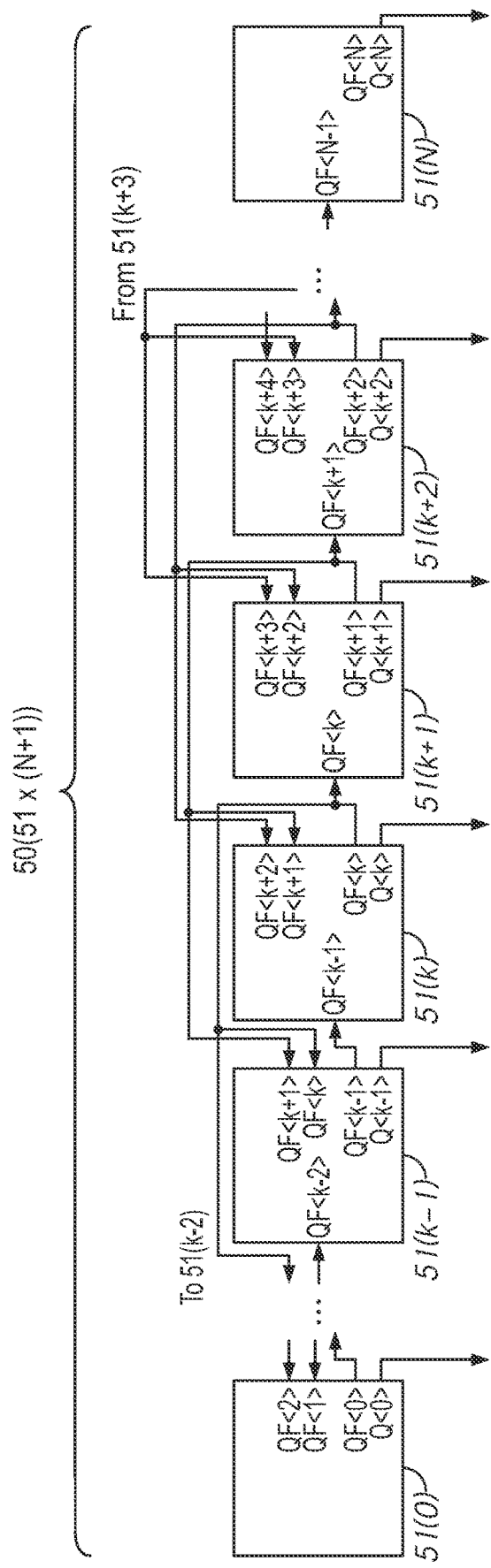
FIG. 5 is a schematic diagram of a shift register circuit in a DLL circuit in accordance with an embodiment of the present disclosure.

FIG. 5 is a schematic diagram of a shift register circuit 50 in a DLL circuit in accordance with an embodiment of the present disclosure. In some embodiments, the shift register circuit 50 may be included in the shift register circuit 2111 of FIG. 2B. Note a structure of the shift register circuit 2111 of FIG. 2B is not limited to this shift register circuit 50 (51). The shift register circuit 50 may include shift registers 51(0)-51(N). The shift registers 51(0)-51(N) may be coupled in series, and receive various control and clock signals. After an initialization, the shift registers 51(0)-51(N) may be preset to provide all bits of a thermometer code Q<0:N> set to "1" respectively. In a normal operation as a shift register, depending on a direction of shift, a shift register 51($k$) may receive either a complementary bit of QF<k−1> that is an inverted bit of Q<k−1> from a shift register 51($k$−1) and QF<k+1> that is an inverted bit of Q<k+1> from a shift register 51($k$+1). Depending on a direction of shift, the shift register 51($k$) may provide either Q<k+1> or Q<k−1> after inversion of either QF<k+1> or QF<k−1>.

In some embodiments, the shift register 51($k$) may also receive a complementary bit QF<k+2> from a shift register 51($k$+2). The shift register 51($k$) may provide a bit Q<k>. The bit Q<k> is one bit of a thermometer code Q<0:N>. The shift register 51($k$) may also provide a complementary bit QF<k> to the shift registers 51($k$+1) and 51($k$−1) and a shifter register 51 (k−2) (not shown). In some embodiments, each shift register 51 of the shift registers 51(0)-51(N) may execute the correction operation 30 of FIG. 3. For example, the shift register 51($k$) may check in the operation block 32 whether the bits Q<k−1>, Q<k+1> and Q<k+2> have an identical value x (e.g., "1" or "0") in the operation block 33. If the bits Q<k−1>, Q<k+1> and Q<k+2> have an identical value, then the shift register 51($k$) may provide a bit Q<k> that represents the identical value x. As shown in FIG. 5, these correction operations in the series-connected shift registers 51(0)-51(N) may be performed continuously and concurrently.

Figure 6:
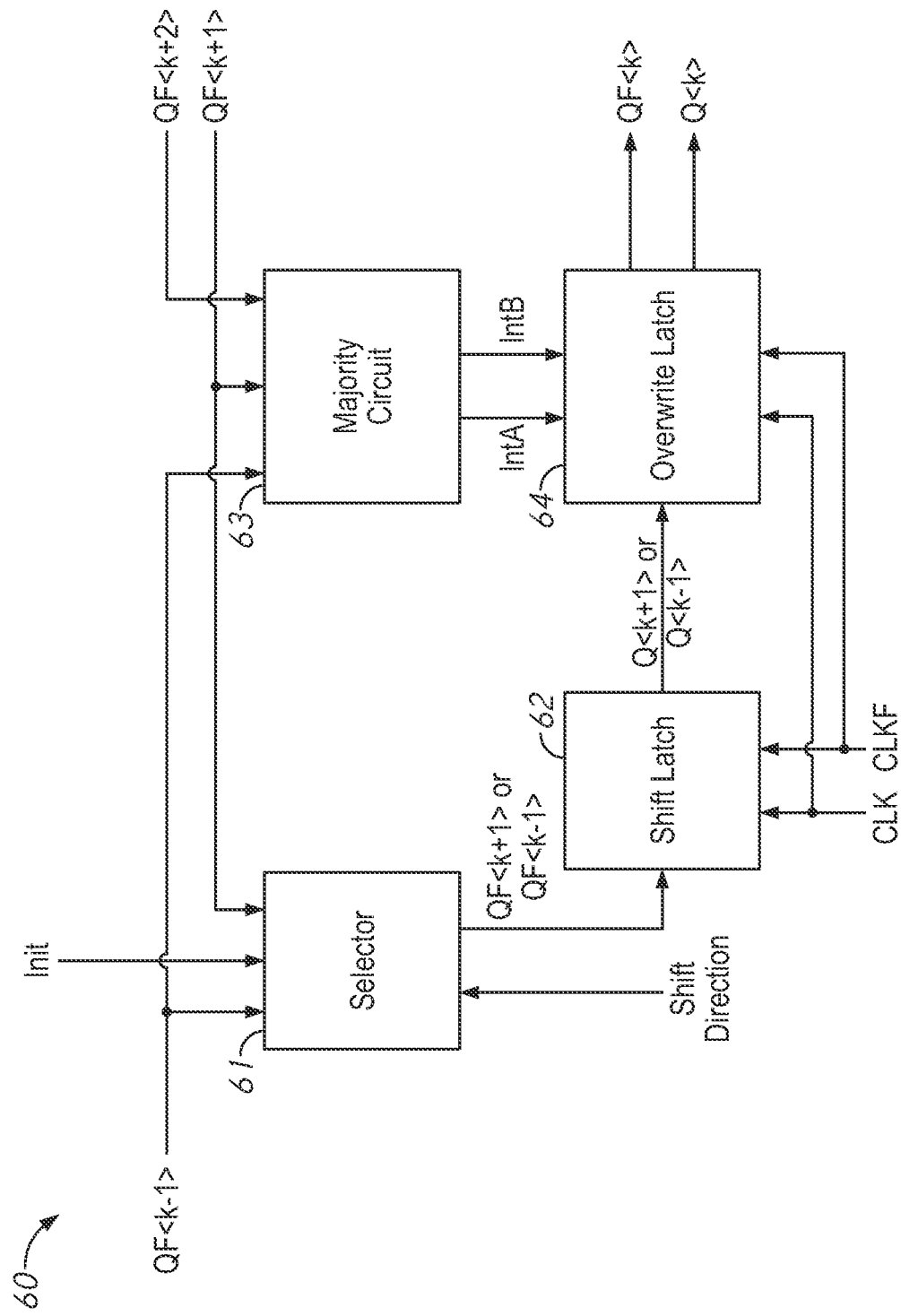
FIG. 6 is a schematic diagram of a shift register in accordance with an embodiment of the present disclosure.

FIG. 6 is a block diagram of a shift register 60 in accordance with an embodiment of the present disclosure. In some embodiments, the shift register 60 may be a shift register 51 of the plurality of shift registers 50. The shift register 60 may include a selector 61, a shill latch 62, a majority circuit 63 and an overwrite latch 64. The selector 61 may start an operation responsive to an initializing signal Init. The selector 61 may receive a shift direction control signal which indicates a shift direction of bits in a thermometer code Q<0:N>. In some embodiments, the shift direction control signal may be provided by the delay line control circuit 240 in FIG. 2A. The selector 61 may further receive bits QF<k−1> and QF<k+1> from adjacent shift registers that may provide immediately adjacent bits Q<k−1> and Q<k+1> to a bit Q<k> of the thermometer code Q<0:N>, The QF<k−1> and QF<k+1> are complementary bits of the immediately adjacent bits Q<k−1> and Q<k+1> after inversion, respectively. Responsive to the shift direction control signal, the selector 61 may provide either QF<k−1> or QF<k+1> to the shift latch 62. When Q<k−1> and Q<k+1> may be "0" and "1" respectively, Q<k> may be set to "0" or "1" depending on the shift direction. For example, if the shift direction is set to left in order to increase the thermometer code Q<0:N>, Q<k> may be set to "1" of Q<k+1>. If the shift direction is set to right in order to decrease the thermometer code Q<0:N>, Q<k> may be set to "0" of Q<k−1>. The shift latch 62 may provide a normal shift register operation. The shift latch 62 may receive a bit that is either QF<k−1> or QF<k+1> from the selector 61. The shift latch 62 may receive a clock signal CLK and its complementary clock signal CLKF. Responsive to the clock signal CLK being active, the shift latch 62 may latch the bit, either QF<k−1> or QT<k+1> from the selector 61. The shift latch 62 may provide the latched bit after inversion, either Q<k−1> or Q<k+1>, to the overwrite latch 64.

The majority circuit 63 may receive the complementary bits QF<k−1> and QF<k+1> from adjacent shift registers (e.g., shift registers 51($k$−1) and 51($k$+1) of FIG. 5). The majority circuit 63 may also receive a complementary bit QF<k+2> from another shift register (e.g., shift registers 51($k$+2) of FIG. 5). Responsive to the complementary bits QF<k−1>, QF<k+1> and QF<k+2>, the majority circuit 63 may provide intermediate signals IntA and IntB.

The overwrite latch 64 may receive the clock signal GU (and its complementary clock signal (IKE The overwrite latch 64 may also receive an adjacent bit, either Q<k−1> or Q<k+1>, from the shift latch 62. The overwrite latch 64 may also receive the intermediate signals IntA and IntB from the majority circuit 63. In some embodiments, the overwrite latch 64 may provide either Q<k−1> or Q<k+1>, from the shift latch 62 that performs the normal shift register operation responsive to the clock signal CLK being active. In some embodiments, the clock signal CLK may be a one-shot pulse signal. The over write latch 64 may perform a correction operation responsive to the clock signal CIA (being inactive and the complementary clock signal CLKF being active. In some embodiments, responsive to the clock signal CLK being inactive and the complementary clock signal CLKF being active, the overwrite latch 64 may provide a corrected bit as Q<k> based on the intermediate signals IntA and IntB. The corrected bit Q<k> may be set to "1" when QF<k−1>, QF<k+1> and QF<k+2> are "0." The corrected bit Q<k> may be set to "0" when QF<k−1>=, QF<k+1> and QF<k+2> are "1." When QF<k−1>, QF<k+1> and QF<k+2> are not the same, then the overwrite latch 64 may provide Q<k> without correction.

Figure 7A:
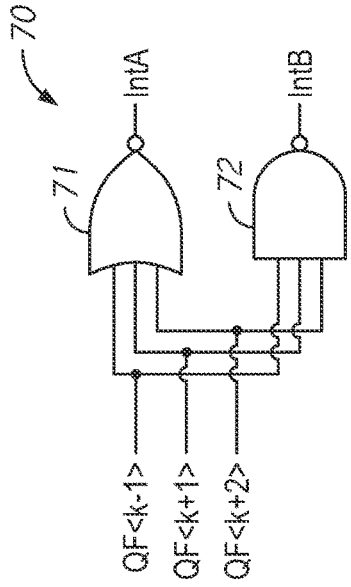
FIG. 7A is a schematic diagram of a majority circuit in accordance with an embodiment of the present disclosure.

FIG. 7A is a schematic diagram of a majority circuit 70 in accordance with an embodiment of the present disclosure. In some embodiments, the majority circuit 70 may be the majority circuit 63 of FIG. 6. The majority circuit 70 may be a logic circuit. In some embodiments, a logic high ("1")

level may be represented by a relatively high voltage (e.g., a positive power supply voltage VDD) and a logic low ("0") level may be represented by a relatively low voltage (e.g., a negative power supply voltage VSS or a ground voltage), For example, the majority circuit 70 may include a logic NOR gate 71 that may perform an inversion of a logical disjunction (e.g., a logic NOR operation) of input signals and a logic NAND gate 72 that may perform an inversion of a logical conjunction (e.g., a logic NAND operation) of input signals. The logic NOR gate 71 and the logic NAND gate 72 may receive the complementary bits QF<k−1>, QF<k+1> and QF<k+2> as input signals. The logic NOR gate 71 may provide an intermediate signal IntA and the logic NAND gate 72 may provide an intermediate signal IntB. In some embodiments, the intermediate signals IntA and IntB may be the intermediate signals IntA and IntB in FIG. 6. The logic NOR gate 71 and the logic NAND gate 72 may provide "0" as the intermediate signals IntA and IntB when QF<k−1>, QF<k+1> and QF<k+2> are "1." The logic NOR gate 71 and the logic NAND gate 72 may provide "1" as the intermediate signals IntA and IntB when QF<k−1>, QF<k+1> and QF<k+2> are "0." If any of QF<k−1>, QF<k+1> and QF<k+2> is different from the other two, the logic NOR gate 71 may provide "0" as the intermediate signal IntA and the logic NAND gate 72 may provide "1" as the intermediate signal IntB.

Figure 7B:
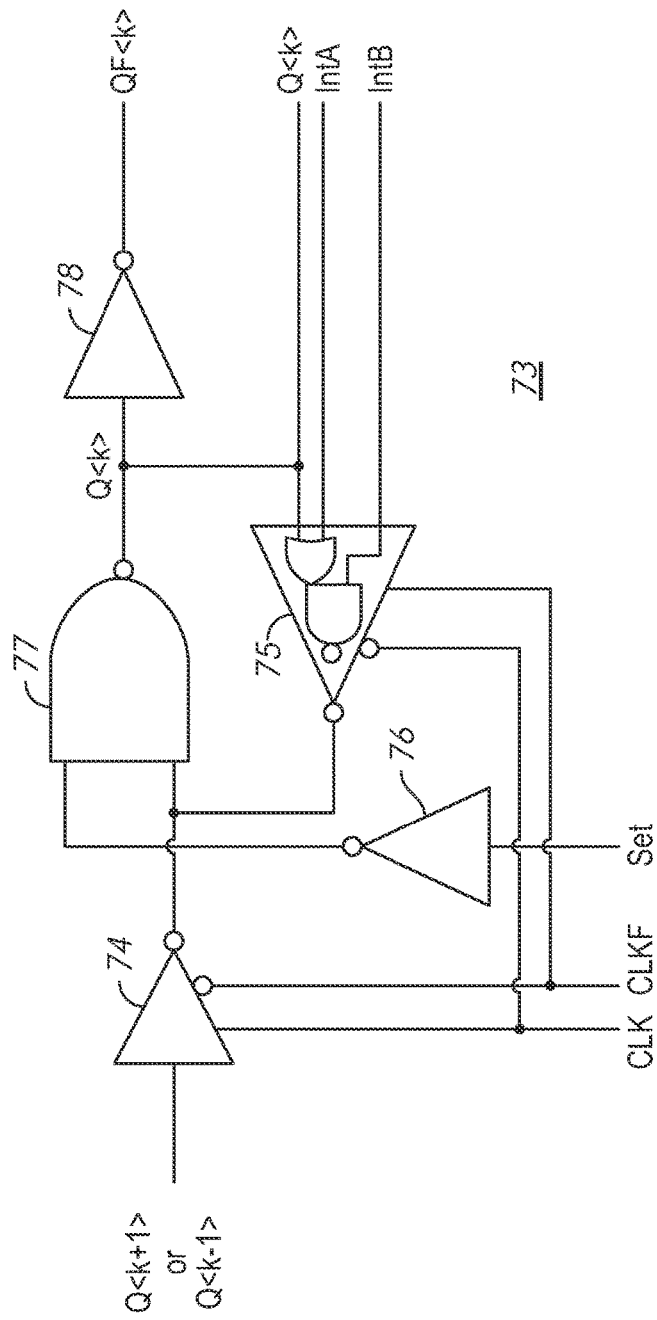
FIG. 7B is a schematic diagram of an overwrite latch in accordance with an embodiment of the present disclosure.

FIG. 7B is a schematic diagram of an overwrite latch 73 in accordance with an embodiment of the present disclosure. In some embodiments, the overwrite latch 73 may be the overwrite latch 64 of FIG. 6. The overwrite latch 73 may be a logic circuit. In some embodiments, a logic high ("1") level may be represented by a relatively high voltage (e.g., a positive power supply voltage VDD) and a logic low ("0") level may be represented by a relatively low voltage (e.g., a negative power supply voltage VSS or a ground voltage).

The overwrite latch 73 may include an inverter 74. In some embodiments, the inverter 74 may be a tri-state (High-Z) inverter. The inverter 74 may receive the latched bit, either Q<k−1> or Q<k+1>. The inverter 74 may further receive a clock signal CLK and its complementary clock signal CLKF. Responsive to the clock signal CLK being active, the inverter 74 may provide the latched bit, either Q<k−1> or Q<k+1>. When the dock signal CLK is being inactive and the complementary clock signal CLKF is in an active state, the inverter 74 may not provide any level as a result of a high impedance state.

The overwrite latch 73 may include a logic circuit 75. The logic circuit 75 may perform logic operations responsive to the complementary clock signal CLKF in an active state and the clock signal CLK in an inactive state. In other words, the logic circuit 75 may be enabled when the inverter 74 is disabled, and the logic circuit 75 may be disabled when the inverter 74 is enabled. The logic circuit 75 may receive an output bit Q<k> of the overwrite latch 73 and intermediate signals IntA and IntB. In some embodiments, the intermediate signals IntA and IntB may be the intermediate signals IntA and IntB from the majority circuit 63. In some embodiments, the intermediate signals IntA and IntB may be the intermediate signals IntA and IntB from the majority circuit 70. The logic circuit 75 may include a logic OR gate. The logic OR gate may receive the intermediate signal IntA and the output bit Q<k> and may perform a logical disjunction (e.g., a logic OR operation) of these two received signals. Thus, the logic OR gate may provide "1" if the intermediate signal IntA is "1". If the intermediate signal IntA is "0," then the logic OR gate may provide the output bit Q<k>. The logic circuit 75 may further include a logic NAND gate. The logic NAND gate may receive the intermediate signal IntB and an output of the logic OR gate, and may perform a logic NAND operation of these two received signals. Thus, if the intermediate signal IntA is "1" and the intermediate signal IntB is also "1" then the logic NAND gate may provide "0," If the intermediate signal IntB is "0" then the logic NAND gate may provide "1." If the intermediate signal IntA is "0" and the intermediate signal IntB is "1", then the logic AND gate may provide the inverted output bit QF<k>, The logic circuit 75 may further include an inverter that may invert an output signal of the logic AND gate. Thus, when the logic circuit is enabled, the logic circuit 75 may provide "1" if Q<k−1>, Q<k+1> and Q<k+2> are "1", and may provide "0," if Q<k−1>, Q<k+1> and Q<k+2> are "0." The logic circuit 75 may provide the output bit Q<k> if any of Q<k+1>, Q<k+1> and Q<k+2> is different from the other two.

The overwrite latch 73 may include a logic NAND gate 77. The logic NAND gate 77 may receive a set signal after inversion by an inverter 76. The logic NAND gate 77 may, also receive either the output signal of the inverter 74 or the output signal of the logic circuit 75, depending on a state of the clock signal CLK. The logic NAND gate 77 may provide the output bit Q<k> being "1" responsive to the set signal in an active state for a preset operation. The logic NAND gate 77 may provide either the Q<k+1> or Q<k−1> responsive to the clock signal CLK is in the active state. The logic NAND gate 77 may provide an identical value x (e.g., "1" or "0") as Q<k> when the bits Q<k−1>, Q<k+1> and Q<k+2> represent the identical value x. The logic NAND gate 77 may provide the output bit Q<k> as is, if any of the bits Q<k−1>, Q<k+1> and Q<k+2> is different from the other two bits. The overwrite latch 73 may also include an inverter 78 that may invert the output bit Q<k> and provide a complementary bit QF<k>.

Figure 8A:
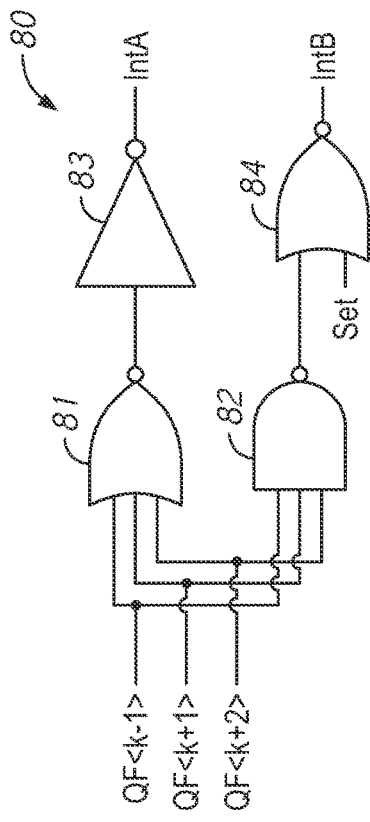
FIG. 8A is a schematic diagram of a majority circuit in accordance with an embodiment of the present disclosure.

FIG. 8A is a schematic diagram of a majority circuit 80 in accordance with an embodiment of the present disclosure. In some embodiments, the majority circuit 80 may be the majority circuit 63 of FIG. 6. The majority circuit 80 may be a logic circuit. In some embodiments, a logic high ("1") level may be represented by a relatively high voltage (e.g., a positive power supply voltage VDD) and a logic low ("0") level may be represented by a relatively low voltage (e.g., a negative power supply voltage VSS or a ground voltage). For example, the majority circuit 80 may include a logic NOR gate 81 and an inverter 83 coupled in series, and a logic NAND gate 82 and a logic NOR gate 84 coupled in series. The logic NOR gate 81 and the logic NAND gate 82 may receive the complementary bits QF<k−1>, QF<k+1> and QF<k+2>. The logic NOR gate 81 may perform a logic NOR operation of the complementary bits QF<k−1>, QF<k+1> and QF<k+2> and may provide an output signal. An inverter 83 may receive the output signal from the logic NOR gate 81 and may invert the output signal into an intermediate signal IntA. The logic NAND gate 82 may perform a logic NAND operation of the complementary bits QF<k−1>, QF<k+1> and QF<k+2> and provide another output signal. A logic NOR gate 84 may receive a set signal and the other output signal from the logic NAND gate 82 as input signals. The logic NOR gate 84 may perform a logic NOR operation of the input signals, and provide an intermediate signal IntB. In some embodiments, the intermediate signals IntA and IntB may be the intermediate signals IntA and IntB in FIG. 6. The majority circuit 80 may provide "0" as the intermediate signal IntA and either "0" or an inverted signal of the set signal as the intermediate signal IntB when QF<k−1>, QF<k+1> and QF<k+2> are "0," The majority circuit 80 may provide "1" as the intermediate signal IntA and either "1" or the inverted signal of the set signal as the intermediate signal IntB when QF<k−1>, QF<k+1> and QF<k+2> are "1." If any of QF<k−1>, QF<k+1> and QF<k+2> is different from the other two, the majority circuit 80 may provide "1" as the intermediate signal IntA and either "0" or the inverted signal of the set signal as the intermediate signal IntB.

Figure 8B:
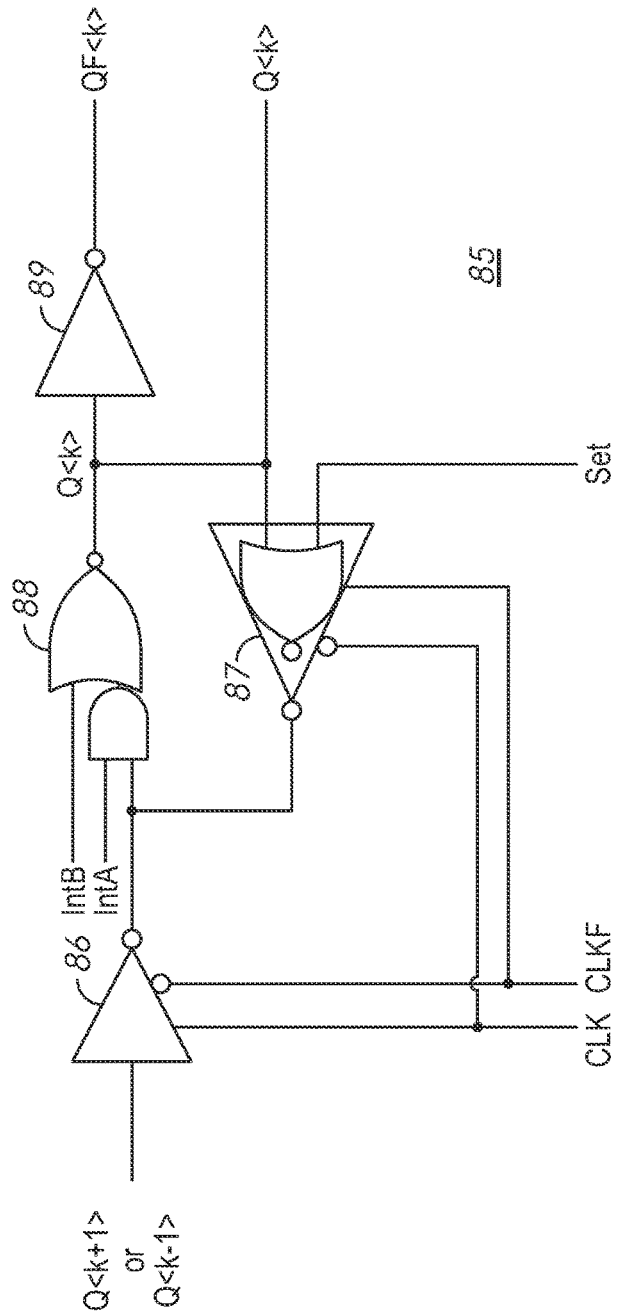
FIG. 8B is a schematic diagram of an overwrite latch in accordance with an embodiment of the present disclosure.

FIG. 8B is a schematic diagram of an overwrite latch 85 in accordance with an embodiment of the present disclosure. In some embodiments, the overwrite latch 85 may be the overwrite latch 64 of FIG. 6. The overwrite latch 85 may be a logic circuit. In some embodiments, a logic high ("1") level may be represented by a relatively high voltage (e.g., a positive power supply voltage VDD) and a logic low ("0") level may be represented by a relatively low voltage (e.g., a negative power supply voltage VSS or a ground voltage).

The overwrite latch 85 may include an inverter 86. In some embodiments, the inverter 86 may be a tri-state (High-Z) inverter. The inverter 86 may receive the latched bit, either Q<k−1> or Q<k+1>, The inverter 86 may further receive a clock signal CLK and its complementary clock signal CLIFF. Responsive to the clock signal CLK being active, the inverter 86 may provide the latched bit, either Q<k−1> or Q<k+1>. When the clock signal CLK is being inactive and the complementary clock signal CEDE is in an active state, the inverter 86 may not provide any level as a result of a high impedance state.

The overwrite latch 85 may include a logic circuit 87. The logic circuit 87 may perform logic operations responsive to the complementary clock signal CLKF in an active state and the clock signal CLK in an inactive state. In other words, the logic circuit 87 may be enabled when the inverter 86 is disabled, and the logic circuit 87 may be disabled when the inverter 86 is enabled. The logic circuit 87 may receive an output bit Q<k> of the overwrite latch 85 and intermediate signals IntA and IntB. In some embodiments, the intermediate signals IntA and IntB may be the intermediate signals IntA and IntB from the majority circuit 63. In some embodiments, the intermediate signals IntA and IntB may be the intermediate signals IntA and IntB from the majority circuit 80. The logic circuit 87 may include a logic OR gate. The logic OR gate may receive a set signal and the output bit Q<k> and may perform a logic OR operation of these two received signals. Thus, the logic OR gate may provide "0" if the set signal is activated. If the set signal is not activated, then the logic OR gate may provide an inverted output bit QF<k>. The logic circuit 87 may further include an inverter that may invert an output signal of the logic OR gate. Thus, when the logic circuit is enabled, the logic circuit 87 may provide "1" if the set signal is activated, and may provide Q<k> if the set signal is not activated.

The overwrite latch 85 may include another logic circuit 88. The logic circuit 88 may include a logic AND gate that may receive the intermediate signal IntA and an output signal of the logic circuit 87 and provide an output signal of the logic NAND operation. The logic circuit 88 may provide the output bit Q<k> being "1" responsive to the set signal in an active state for a preset operation. The logic circuit 88 may provide either the Q<k+1> or Q<k−1> responsive to the clock signal CLK is in the active state. The logic circuit 88 may provide an identical value x (e.g., "1" or "0") as Q<k> when the bits Q<k−1>, Q<k+1> and Q<k+2> represent the identical value x. The logic circuit 88 may provide the output bit Q<k> without change if any of the bits Q<k−1>, Q<k+1> and Q<k+2> is different from the other two bits and when the set signal is not activated. When the set signal is activated, the logic circuit 88 may provide Q<k> being set to "1." The overwrite latch 85 may also include an inverter 88 that may invert the output bit Q<k> and provide a complementary bit QF<k>.

Figure 9:
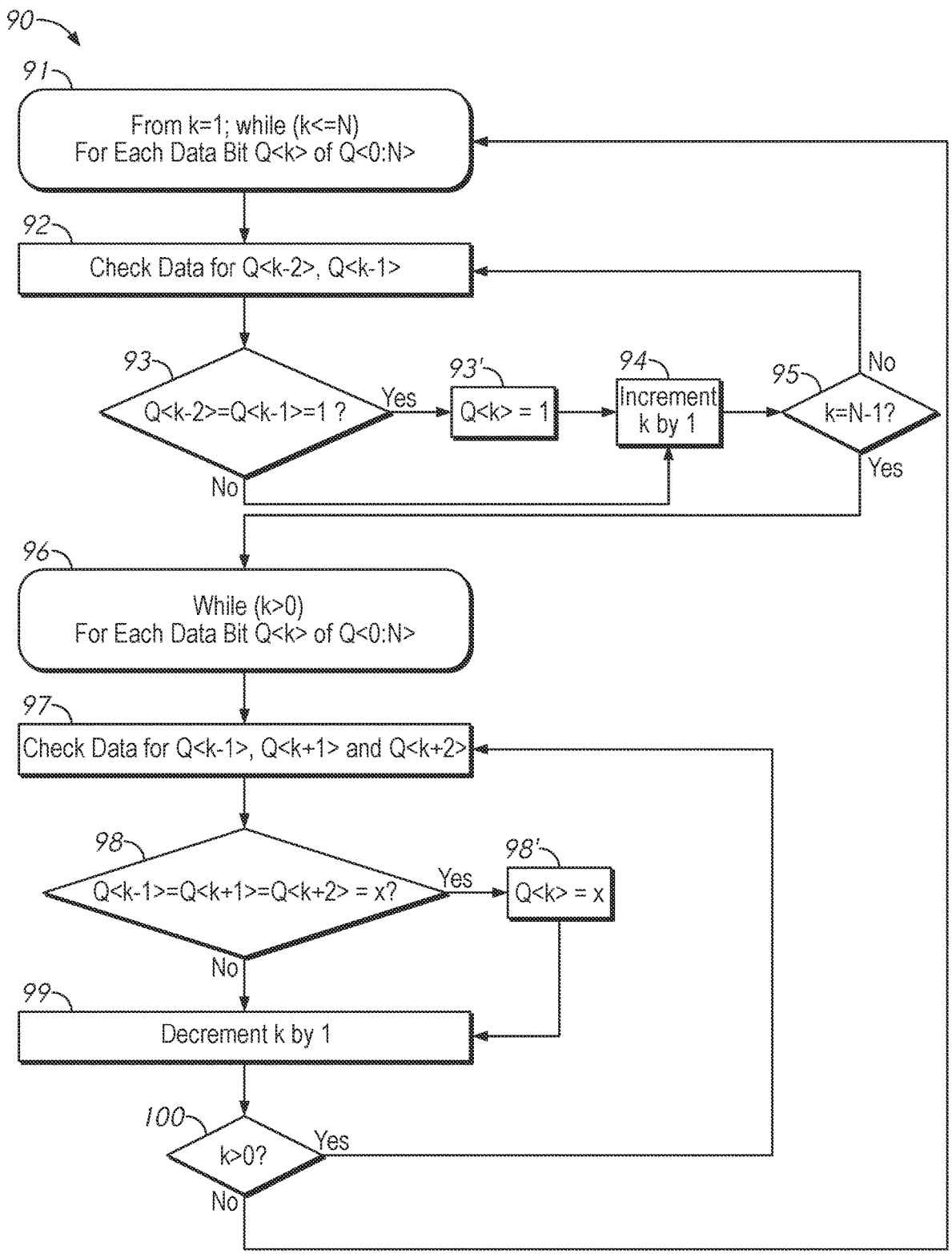
FIG. 9 is a flow diagram of a correction operation of a thermometer code in a DLL circuit in accordance with an embodiment of the present disclosure.

FIG. 9 is a flow diagram of a correction operation 90 of a thermometer code in accordance with an embodiment of the present disclosure. In some embodiments, the correction operation 90 of the thermometer code Q<0:N> (e.g., N is a natural number) may be performed in the shift register circuit 2111 of FIG. 2B. The thermometer code Q<0:N> may represent a natural number, where the thermometer code includes one or more rightmost bits having "1" and zero or more leftmost bits having "0." The correction operation 90 in FIG. 9 may use adjacent more significant bits relative to a bit Q<k> (e.g., higher bits on one side of the bit Q<k>) in the thermometer code and adjacent less significant bits relative to the bit Q<k> (e.g., lower bits on another side of the bit Q<k>) in the thermometer code in correcting a bit value of the bit Q<k> of the thermometer code Q<0:N>, where k is a natural number less than N. For example, the correction operation 90 in FIG. 9 uses two adjacent bits Q<k+1> and Q<k+2> on a right side of Q<k> and two adjacent bits Q<k−1> and Q<k−2> on a left side of Q<k> in the thermometer code in correcting the bit Q<k>, where k is a natural number less than (N−1).

In some embodiments, the correction operation 90 may include two iterations. A first iteration of the correction operation 90 in FIG. 9 may use two adjacent less significant (e.g., lower) bits Q<k−1> and Q<k−2> of the bit Q<k>, if the two adjacent bits Q<k−1> and Q<k−2> are available. If the four adjacent bits Q<k−1> and Q<k−2> have a predetermined identical value (e.g., "1"), the predetermined identical value of the two adjacent bits Q<k−1> and Q<k−2> may be set as a corrected bit value to the bit Q<k>. In a second iteration of the correction operation 90 in FIG. 9 may use two adjacent more significant bits Q<k+2> and Q<k+1> on one side of the bit Q<k> in the thermometer code and one adjacent less significant bit Q<k−1> on the other side of the bit Q<k>, if the three adjacent bits Q<k+2>, Q<k+1> and Q<k−1> are available. If the three adjacent bits Q<k+2>, Q<k+1> and Q<k−1> have an identical value (e.g., "1" or "0"), the identical value may be set as a corrected bit value to the bit Q<k>. The above operation is merely an example; in some embodiments, a correction operation may weigh one or more adjacent more significant bits in the thermometer code more than one or more adjacent less significant bits in the thermometer code, and in another embodiments, a correction operation may weigh one or more adjacent less significant bits in the thermometer code more than one or more adjacent more significant bits in the thermometer code.

For example, the first iteration may include operation blocks 91 to 95 of FIG. 9. In an operation block 91, a correction operation may be initiated to execute the operation for each bit of Q<k> of the thermometer code Q<0:N> and for each natural number k that is equal to or less than (N). In operation block 92, the two adjacent data Q<k−2> and Q<k−1> are checked. If two adjacent data Q<k−2> and Q<k−1> have a predetermined identical value, such as 1" in the operation block 93 ("Yes"), then Q<k> is set to the predetermined identical value "1" in the operation block 93' then the operation proceeds to an operation block 94. If any of the two adjacent data Q<k−2> and Q<k−1> have a value which is not the predetermined value in the operation block 93 ("No"), then the operation proceeds to the operation block 94. In either case, k is incremented in the operation block 94. In the operation block 94, k is incremented by one and proceeds to an operation block 95. If k is not smaller than (N−1) in the operation block 95, then the operation proceeds to back to the operation block 92. Thus, this recursive process in the first iteration repeats until the natural number k is equal to the natural number (N−1) in the operation block 95. Once the natural number k becomes equal to the natural number (N−1) in the operation block 95, the correction operation for Q<0:N> proceeds to the second iteration which starts from the operation box 96.

The second iteration may include operation blocks 96-100 of FIG. 9. In an operation block 96, a correction operation may be initiated to execute the operation for each bit of Q<k> of the thermometer code Q<0:N> and for each natural number k. In an operation block 97, adjacent data, such as Q<k−1>, Q<k+1> and Q<k+2> may be received and checked. If the three adjacent data Q<k−1>, Q<k+1> and Q<k+2> have an identical value x (e.g., "1" or "0") in an operation block 98 ("Yes"), the data Q<k> may be set to the identical value x in an operation block 98' then the operation proceeds to an operation block 99. If any of the three neighbor data Q<k−1>, Q<k+1> and Q<k+2> have a different value in the operation block 98 ("No"), then the operation proceeds to the operation block 99. In the operation block 99, k is decremented by one and proceeds to an operation block 100. If k is greater than zero in the operation block ("Yes"), then the operation proceeds to an operation block 97. If k is greater than one in the operation block 100 ("Yes"), then the operation proceeds to the operation block 90. Thus, this recursive process in the second iteration repeats until the natural number k is equal to zero in the operation block 100. Once the natural number k becomes equal to zero in the operation block 100, the correction operation for Q<0:N> has been completed and a new correction operation for next thermometer code Q<0:N> may be performed by proceeding to the operation block 90. This iteration of correction operations continues until Q<0:N> becomes a thermometer code without a bit sequence "10" as Q<k. In some embodiments described above, the correction operation 90 performs bit corrections from a less significant (e.g., lower) bit to a more significant (e.g., higher) bit (e.g., from Q<2> to Q<N−2>). In other embodiments, a similar correction operation may be performed from a more significant bit to a less bit (e.g., from Q<N−2> to Q<2>).

FIG. 10 is a diagram of correction operations of a thermometer code in a DLL, circuit in accordance with an embodiment of the present disclosure. In some embodiments, the correction operation 90 of a thermometer code Q<0:N> (e.g., N is a natural number) may be used and a natural number N may be seven. Q<0> is a leftmost bit and Q<N> is a rightmost bit in examples of the thermometer code of FIG. 10.

In a conversion 101, "1" of Q<3> may be converted into "0." When the natural number k is equal to 3, the adjacent bits Q<2>, Q<4> and Q<5> to the bit Q<3> are checked in the operation block 92 of FIG. 9. Because the adjacent bits Q<2>, Q<4> and Q<5> are all "0" in the operation block 93, Q<3> may be set to "0" in the operation block 94, regardless of the current value of Q<3>. In other conversions 102 and 103, "0" of Q<3> may be converted into "1." When the natural number k is equal to 3, the adjacent bits <2>, Q<4> and Q<5> are checked in the operation block 92 of FIG. 9. Because Q<2>, Q<4> and Q<5> are all "1" in the operation block 93, Q<3> may be set to "1" in the operation block 94, regardless of the current values of Q<3> and Q<1>. In the conversion 102, "1" of Q<2> of the conversion 102 is maintained because Q<4> is "1."

In another conversion 104, "1" of Q<3> may be converted into "0" in a first correction operation of the operation block 91 because the adjacent bits Q<2>, Q<4> and Q<5> are all "0." When the natural number k is equal to 3, the adjacent bits Q<2>, Q<4> and Q<5> are checked in the operation block 92 of FIG. 9. Because the adjacent bits Q<2>, Q<4> and Q<5> are "0" in the operation block 93, Q<3> may be set to "0" in the operation block 93', regardless of the current value of Q<3>. Once this correction operation iteration has been performed for all natural numbers k in a range between 1 and (N−2) in an operation block 98 ("Yes"), a second correction operation of the operation block 91 for next Q<0:N> of the conversion 104 may be performed. In the second correction operation of the operation block 91 of the conversion 104, "1" of Q<1> may be converted into "0." When the natural number k is equal to 1, the adjacent bits Q<0>, Q<2> and Q<3> are checked in the operation block 92 of FIG. 9. Because Q<0>, Q<2> and Q<3> are all "0" in the operation block 93, Q<1> may be set to "0" in the operation block 93', regardless of the current value of Q<1>.

In another conversion 105, "0" of Q<4> may be converted into "1" in a first correction operation of the operation block 91. When the natural number k is equal to 4, the adjacent bits Q<3>, Q<5> and Q<6> are checked in the operation block 92 of FIG. 9, and because the adjacent bits Q<3>, Q<5> and Q<6> are all "1" in the operation block 93, Q<4> may be set to "1" in the operation block 93', regardless of the current value of Q<4>. Once this correction operation iteration has been performed for all natural numbers k in a range between 1 and (N−2) in an operation block 98 ("Yes"), a second correction operation of the operation block 91 for next Q<0:N> of the conversion 105 may be performed. In the second correction operation of the operation block 91 of the conversion 105, "0" of Q<2> may be converted into "1." When the natural number k is equal to 2 in the second correction operation, the adjacent bits Q<1>, Q<3> and Q<4> are checked in the operation block 92 of FIG. 9. Because Q<1>, Q<3> and Q<4> are all "1" in the operation block 93, Q<2> may be set to "1" in the operation block 93', regardless of the current value of Q<2>. As shown in the conversions 104 and 105, the correction operations are performed in iteration until Q<0:N> becomes a thermometer code without a bit sequence "10."

In another conversion 106, "0" of Q<4> may be converted into "1" in a first correction operation of the operation block 91. When the natural number k is equal to 4, Q<3>, Q<5> and Q<6> are checked in the operation block 92 of FIG. 9. Because Q<31> and Q<6> are "1" and Q<5> is "0", the operation proceeds to the operation block 94. Because k is equal to 4 (greater than one), the operation further proceeds to the operation block 95. Q<2> is further checked in the operation block 95 of FIG. 9. Because the adjacent bits Q<2>, Q<3>, Q<6> are all "1" in the operation block 96, Q<4> may be set to "1" in the operation block 96', regardless of the current value of Q<4> and "0" of After incrementing k by one in the operation block 97, the natural number k in the operation block 98 is five, not equal to (N−1) that is six, thus, the operation proceeds to the operation block 92 checking three adjacent bits Q<4>, Q<6> and Q<7> to the bit Q<5>. Because Q<6> and Q<7> are "1" and Q<4> has been set to "1" previously when k was four, Q<4>, Q<6> and Q<7> are all the same value "1" in the operation block 93. Thus, Q<5> may be also set to "1" in the operation block 93'. As shown in the conversions 104 and 105, the correction operations are performed in iteration until Q<0:N> becomes a thermometer code without a bit sequence "10" as Q<k, k+1>.

Figure 11:
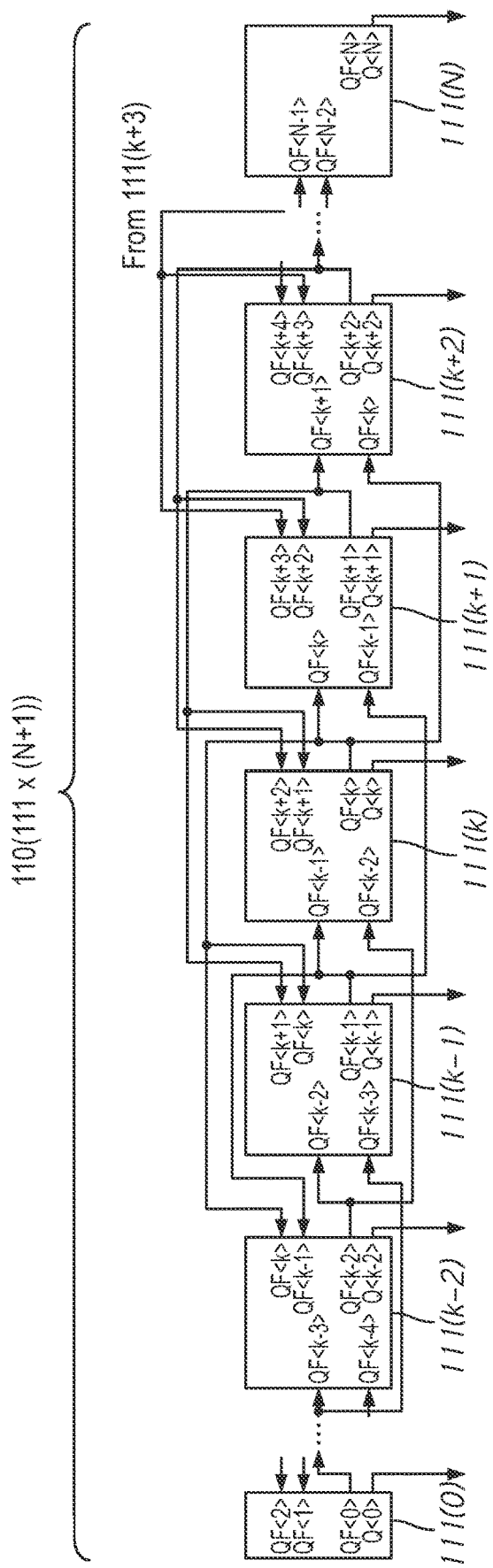
FIG. 11 is a schematic diagram of a shift register circuit in a DLL circuit in accordance with an embodiment of the present disclosure.

FIG. 11 is a schematic diagram of a shift register circuit 110 in a DLL circuit in accordance with an embodiment of the present disclosure. In some embodiments, the shift register circuit 110 may be included in the shift register circuit 2111 of FIG. 2B. Note a structure of the shift register circuit 2111 of FIG. 2B is not limited to this shift register circuit 110 (111). The shift register circuit 110 may include shift registers 111(0)-111(N). The shift registers 111(0)-111(N) may be coupled in series, and receive various control and clock signals. After an initialization, the shift registers 111(0)-111(N) may be preset to provide all bits of a thermometer code Q<0:N> set to "1" respectively. In a normal operation as a shift register, depending on a direction of shift, a shift register 111(k) may receive either a complementary bit of QF<k−1> that is an inverted bit of an adjacent bit Q<k−1> from a shift register 51(k−1) and QF<k E 1> that is an inverted bit of an adjacent bit Q<k+1> from a shift register 111 (k+1). Depending on a direction of shift, the shift register 111(k) may provide either Q<k+1> or Q<k−1> after inversion of either QF<k+1> or QF<k−1>.

In some embodiments, the shift register 111(k) may also receive a complementary bit QF<k+2> from a shift register 111(k+2) and another complementary bit QF<k−2> from a shift register 111(k−2). The shift register 111(k) may provide a bit Q<k>. The bit Q<k> is one bit of a thermometer code Q<0:N>. The shift register 111(k) may also provide a complementary bit QF<k> to the shift registers 111(k+2), 111(k+1), 111(k−1) and 111(k−2). In some embodiments, each shift register 51 of the shift registers 111(0)-111(N) may execute the correction operation 90 of FIG. 9. For example, the shift register 91(k) may check in the operation block 92 whether the bits Q<k−1>, Q<k+1> and Q<k+2> have an identical value x (e.g., "1" or "0") in the operation block 93. If the bits Q<k−1>, Q<k+1> and Q<k+2> have the identical value, then the shift register 111(k) may provide the bit Q<k> that represents the identical value x in the operation block 93'. If a majority of adjacent bits Q<k−2>, Q<k−1>, Q<k+1> and Q<k+2> represent "1" in the operation block 96, then the shift register 111(k) may provide the bit Q<k> set to "1" in the operation block 96'. As shown in FIG. 11, these correction operations in the series-connected shift registers 111(0)-111(N) may be performed continuously and concurrently.

Figure 12:
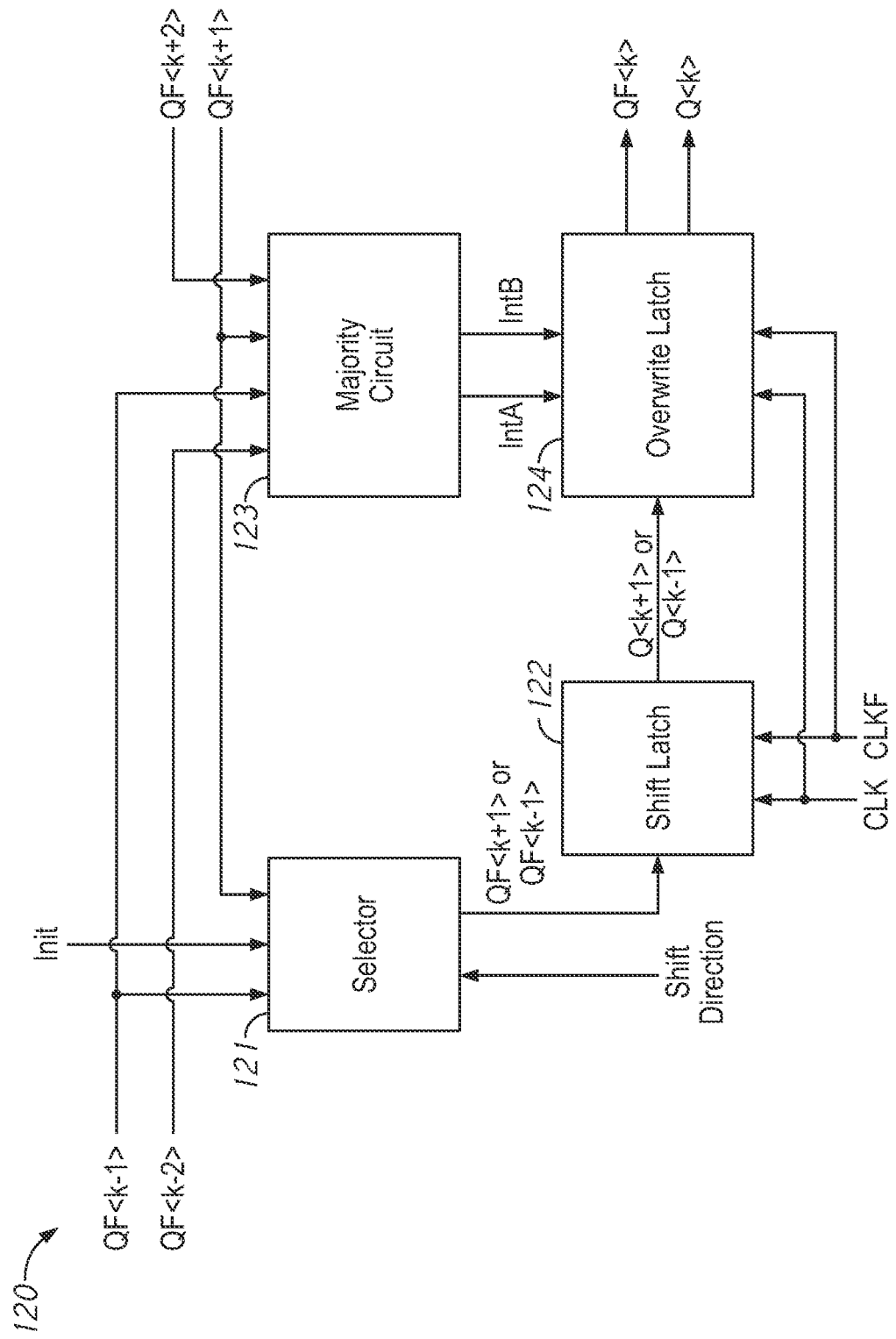
FIG. 12 is a schematic diagram of a shift register in accordance with an embodiment of the present disclosure.

FIG. 12 is a block diagram of a shift register 120 in accordance with an embodiment of the present disclosure. In some embodiments, the shift register 120 may be a shift register 111 of the plurality of shift registers 120. The shift register 120 may include a selector 121, a shift latch 122, a majority circuit 123 and an overwrite latch 124. The selector 121 may start an operation responsive to an initializing signal Init. The selector 121 may receive a shift direction control signal which indicates a shift direction of bits in a thermometer code Q<0:N>. In some embodiments, the shift direction control signal may be provided by the delay line control circuit 240 in FIG. 2A. The selector 121 may further receive bits QF<k−1> and QF<k+1> from adjacent shift registers that may provide immediately adjacent bits Q<k−1> and Q<k+1> to a bit Q<k> of the thermometer code Q<0:N>. The Q<k−1> and QF<k+1> are complementary bits of the immediately adjacent bits Q<k−1> and Q<k+1> after inversion, respectively. Responsive to the shift direction control signal, the selector 121 may provide either QF<k−1> or QF<k+1> to the shift latch 122. When Q<k−1> and Q<k+1> may be "0" and "1" respectively, Q<k> may be set to "0" or "1" depending on the shift direction. For example, if the shift direction is set to left in order to increase the thermometer code Q<0:N>, Q<k> may be set to "1" of Q<k+1>. If the shift direction is set to right in order to decrease the thermometer code Q<0:N>, Q<k> may be set to "0" of Q<k−1>. The shift latch 122 may perform a normal shift register operation. The shift latch 122 may receive a bit that is either QF<k−1> or QF<k+1> from the selector 121. The shift latch 122 may receive a clock signal CLK and its complementary clock signal CLKF. Responsive to the clock signal CLK being active, the shift latch 122 may latch the bit, either QF<k−1> or QF<k+1> from the selector 121. The shift latch 122 may provide the latched bit after inversion, either Q<k−1> or Q<k+1>, to the overwrite latch 124.

The majority circuit 123 may receive the complementary adjacent bits QF<k−2>, QF<k−1>, QF<k+1> and QF<k+2> from adjacent shift registers (e.g., shift registers 111(k−2), 111(k−1), 111(k+1) and 111(k+2) of FIG. 11). Responsive to the complementary bits QF<k−2>, QF<k−1>, QF<k+1> and QF<k+2>, the majority circuit 123 may provide intermediate signals IntA and IntB.

The overwrite latch 124 may receive the clock signal CLK and its complementary clock signal CLKF. The overwrite latch 124 may also receive an adjacent bit, either Q<k−1> or Q<k+1> from the shift latch 122 that performs the normal shift register operation. The overwrite latch 124 may also receive the intermediate signals IntA and IntB from the majority circuit 123. In some embodiments, the overwrite latch 124 may provide the adjacent bit, either Q<k−1> or Q<k+1>, from the shift latch 62 responsive to the clock signal CLK being active. Thus, Q<k> may be either Q<k−1> or Q<k+1> depending on the shift direction control signal. In some embodiments, the clock signal CLK may be a one-shot pulse signal. The overwrite latch 124 may perform a correction operation responsive to the clock signal CLK being inactive and the complementary clock signal CLKF being active. In some embodiments, responsive to the clock signal CLK being inactive and the complementary clock signal CLKF being active, the overwrite latch 124 may provide a corrected bit as Q<k>, based on the intermediate signals IntA and IntB. The corrected bit Q<k> may be set to "0" when QF<k−1>, QF<k+1> and QF<k+2> are "1." The corrected bit Q<k> may be set to "1" when QF<k−1>, QF<k+1> and QF<k+2> are "0." When QF<k+1> and QF<k+2> are not the same, if the majority of QF<k−2>, QF<k−1>, QF<k+1> and QF<k+2> are "0" then the overwrite latch 124 may provide "1" as the corrected bit Q<k>. Otherwise, the overwrite latch 124 may provide Q<k> without correction.

Figure 13A:
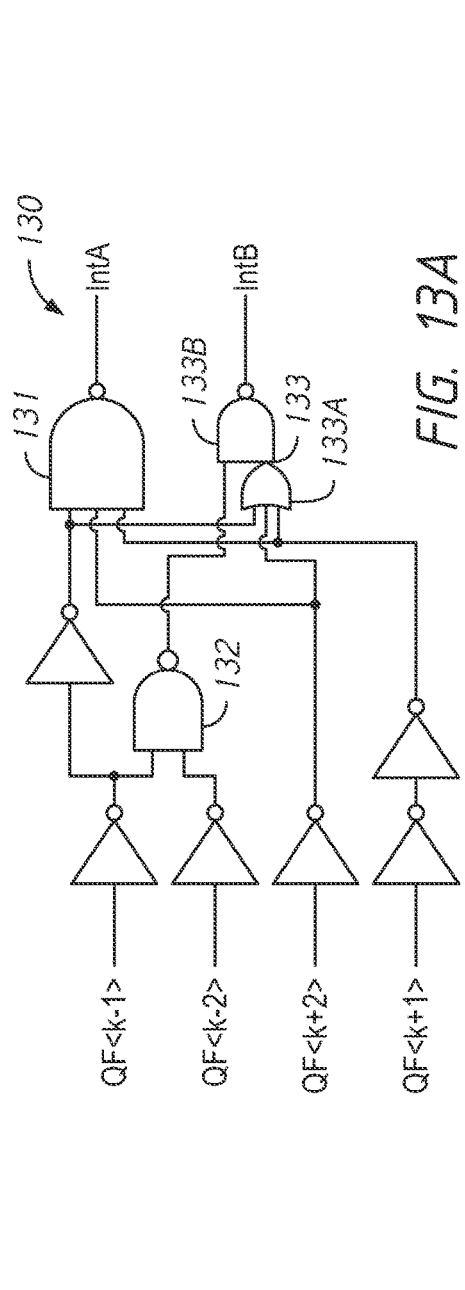
FIG. 13A is a schematic diagram of a majority circuit in accordance with an embodiment of the present disclosure.

FIG. 13A is a schematic diagram of a majority circuit 130 in accordance with an embodiment of the present disclosure. In some embodiments, the majority circuit 130 may be the majority circuit 123 of FIG. 12. The majority circuit 130 may be a logic circuit. In some embodiments, a logic high ("1") level may be represented by a relatively high voltage (e.g., a positive power supply voltage VDD) and a logic low ("0") level may be represented by a relatively low voltage (e.g., a negative power supply voltage VSS or a ground voltage). In some embodiments, the majority circuit 130 may include a logic NAND gate 131 that may perform an inversion of a logical conjunction (e.g., a logic NAND operation) of input signals. The logic NAND gate 131 may receive complimentary bits of the adjacent bits QF<k−1> and QF<k+1> and a bit Q<k+2> as input signals, and the logic NAND gate 131 may provide an intermediate signal IntA. For example, the intermediate signal IntA may be "0" if the complimentary bits QF<k−1> and QF<k+1> and the bit Q<k+2> are "1." Otherwise, the intermediate signal IntA may be "1."

In some embodiments, the majority circuit 130 may include a logic circuit 133. The logic circuit 133 may receive complementary bits QF<k−1> and QF<k+1> and a bit Q<k+2> as input signals. The logic circuit 133 may include a logic OR gate 133A. The logic OR gate 133A may receive the complementary bits QF<k−1> and QF<k+1> and the bit Q<k+2> and may perform a logical disjunction (e.g., a logic OR operation) of these three received signals. Thus, the logic OR gate 133A may provide "1" if any of the complementary bits QF<k−1> and QF<k+1> and the bit Q<k+2> is "1." if the complementary bits QF<k−1> and QF<k+1> and the bit Q<k+2> are "0," then the logic OR gate 133A may provide "0." The logic circuit 133 may further include a logic NAND gate 133B. The logic NAND gate 133B may receive an output signal of the logic OR gate 133A and an output signal of another logic NAND gate 132 that provides a NAND operation of bits Q<k−1> and Q<k−2>. The logic NAND gate 133B may perform a logic NAND operation of these two received signals. Thus, if the output signal of the logic OR gate 133A is "1" and the output signal of the logic NAND gate 132 is "1" then the logic NAND gate 133B may provide "0." Otherwise, the logic NAND gate 133B may provide "0."

Figure 13B:
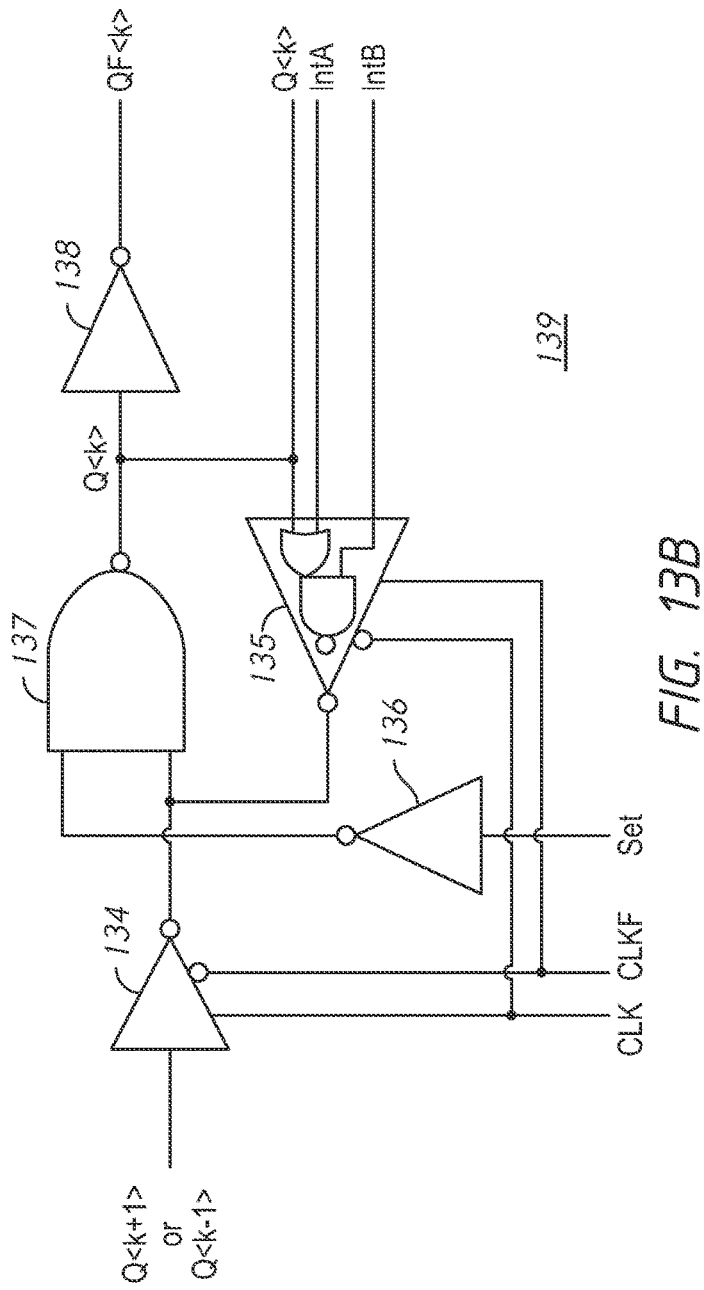
FIG. 13B is a schematic diagram of an overwrite latch in accordance with an embodiment of the present disclosure.

FIG. 13B is a schematic diagram of an overwrite latch 139 in accordance with an embodiment of the present disclosure. In some embodiments, the overwrite latch 139 may be the overwrite latch 124 of FIG. 12. The overwrite latch 139 may be a logic circuit. In some embodiments, a logic high ("1") level may be represented by a relatively high voltage (e.g., a positive power supply voltage VDD) and a logic low ("0") level may be represented by a relatively low voltage (e.g., a negative power supply voltage VSS or a ground voltage).

The overwrite latch 139 may include an inverter 134. In some embodiments, the inverter 134 may be a tri-state (High-Z) inverter. The inverter 134 may receive the latched bit, either Q<k−1> or Q<k+1>. The inverter 134 may further receive a dock signal CU (and its complementary clock signal CLKF. Responsive to the clock signal CLK being active, the inverter 134 may provide the latched bit, either Q<k−1> or Q<k+1>. When the clock signal CLK is being inactive and the complementary clock signal CLKF is in an active state, the inverter 134 may not provide any level as a result of a high impedance state.

The overwrite latch 139 may include a logic circuit 135. The logic circuit 135 may perform logic operations responsive to the complementary clock signal CLKF in an active state and the clock signal CLK in an inactive state. In other words, the logic circuit 135 may be enabled when the inverter 134 is disabled, and the logic circuit 135 may be disabled when the inverter 134 is enabled. The logic circuit 135 may receive an output bit Q<k> of the overwrite latch 139 and intermediate signals IntA and IntB. In some embodiments, the intermediate signals IntA and IntB may be the intermediate signals IntA and IntB from the majority circuit 123. In some embodiments, the intermediate signals IntA and IntB may be the intermediate signals IntA and IntB from the majority circuit 130. The logic circuit 135 may include a logic OR gate. The logic OR gate may receive the intermediate signal IntA and the output bit Q<k> and may perform a logical disjunction (e.g., a logic OR operation) of these two received signals. Thus, the logic OR gate may provide "1" if the intermediate signal IntA is "1". If the intermediate signal IntA is "0," then the logic OR gate may provide the output bit Q<k>. The logic circuit 135 may further include a logic NAND gate. The logic NAND gate may receive the intermediate signal IntB and an output of the logic OR gate, and may perform a logic NAND operation of these two received signals. Thus, if the intermediate signal IntA is "1" and the intermediate signal IntB is also "1" then the logic NAND gate may provide "0," If the intermediate signal IntB is "0" then the logic NAND gate may provide "1." If the intermediate signal IntA is "0" and the intermediate signal IntB is "1", then the logic AND gate may provide the inverted output bit QF<k>. The logic circuit 135 may further include an inverter that may invert an output signal of the logic AND gate. For example, the logic circuit 135 may provide an identical value x (e.g., "1" or "0") as Q<k> when the bits Q<k−1>, Q<k+1> and Q<k+2> represent the identical value x. Even if any of the bits Q<k−1>, Q<k+1> and Q<k+2> is different from the other two bits, the logic circuit 135 may provide a value "1" if three bits of the bits Q<k−2>, Q<k−1>, Q<k+1> and Q<k+2> is "1." Otherwise, the logic circuit 135 may provide the output bit Q<k> as is.

The overwrite latch 139 may include a logic NAND gate 137. The logic NAND gate 137 may receive a set signal after inversion by an inverter 136. The logic NAND gate 137 may also receive either the output signal of the inverter 134 or the output signal of the logic circuit 135, depending on a state of the clock signal UK. The logic NAND gate 137 may provide the output bit Q<k> being "1" responsive to the set signal in an active state for a preset operation. The logic NAND gate 137 may provide either the Q<k+1> or Q<k−1> responsive to the clock signal CLK is in the active state. When the set signal and clock signal CLK are not active, the logic NAND gate 137 may provide an output signal from the logic circuit 135. For example, the logic NAND gate 137 may provide an identical value x (e.g., "1" or "0") as Q<k> when the bits Q<k−1>, Q<k+1> and Q<k+2> represent the identical value x. Even if any of the bits Q<k−1>, Q<k+1> and Q<k+2> is different from the other two bits, the logic NAND gate 137 may provide a value "1" if three bits of the bits Q<k−2>, Q<k−1>, Q<k+1> and Q<k+2> is "1." Otherwise, the logic NAND gate 137 may provide the output bit Q<k> as is. The overwrite latch 139 may also include an inverter 138 that may invert the output bit Q<k> and provide a complementary bit QF<k>.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus, comprising:
    an adjustable delay line configured to adjust an amount of a delay responsive to a thermometer code; and
    a shift register circuit comprising:
        a first shift register configured provide a first bit of the thermometer code;
        a second shift register configured to provide a second bit of the thermometer code;

a third shift register to provide a third bit of thermometer code; and a fourth shift register configured to provide a fourth bit of the thermometer code, wherein the second shift register is configured to receive complementary bits of the first bit and the third bit, and further configured to provide either the first bit or the third bit as the second bit based on a shift direction during a shift register operation, wherein the third shift register is configured to receive complementary bits of the second bit and the fourth bit, and further configured to provide either the second bit or the fourth bit as the third bit based on the shift direction during the shift register operation, wherein the third shift register is further configured to receive a complementary bit of the first bit, wherein the third shift register is configured to provide a first value as the third bit, if the first bit, the second bit and the fourth bit are the first value during a correction operation, and wherein the third shift register is configured to provide a second value as the third bit, if the first bit, the second bit and the fourth bit are the second value during the correction operation.

2. The apparatus of claim 1, wherein the first bit and the second bit are more significant bits relative to the third bit in the thermometer code, and wherein the fourth bit is a less significant bit relative to the third bit in the thermometer code.

3. The apparatus of claim 2, wherein the thermometer code represents a natural number including one or more most significant bits having the first value and zero or more least significant bits having the second value.

4. The apparatus of claim 1, wherein the second bit and the fourth bit are immediately adjacent to the third bit, and the first bit is adjacent to the second bit in the thermometer code.

5. The apparatus of claim 1, further comprising a fifth shift register configured to provide a fifth bit of the thermometer code, wherein the fourth shift register is configured to receive complementary bits of the third bit and the fifth bit, and further configured to provide either the third bit or the fifth bit as the fourth bit during the shift register operation, and wherein the third shift register is further configured to receive a complementary bit of the fifth bit, and configured to provide a predetermined value as the third bit during the correction operation, if a majority of the first bit, the second bit, the fourth bit and the fifth bit are the predetermined value.

6. The apparatus of claim 5, wherein the predetermined value is one.

7. The apparatus of claim 5, wherein the first bit and the second bit are on more significant bits relative to the third bit in the thermometer code, and wherein the fourth bit and the fifth bit are less significant bits relative to the third bit in the thermometer code.

8. An apparatus, comprising:

an adjustable delay line configured to adjust an amount of a delay responsive to a thermometer code; and a shift register configured to provide a bit of the thermometer code responsive to two adjacent more significant bits including an immediately adjacent more significant bit relative to the bit and an immediately adjacent less significant bit relative to the bit in the thermometer code, wherein the shift register is configured to provide one of the immediately adjacent bits as the bit based on a shift direction responsive to a signal being active, wherein the shift register is configured to provide a value responsive to the signal being inactive, if the two adjacent more significant bits and the immediately adjacent less significant bit have the same value.

9. The apparatus of claim 8, wherein the signal is a clock signal, and wherein the shift register comprises:

a majority circuit configured to receive complementary bits of the two more significant adjacent bits relative to the bit and a complementary bit of the adjacent less significant bit relative to the bit and further configured to provide first and second intermediate signals; and an overwrite latch configured to receive the first and second immediate signals and a complementary clock signal of the clock signal, and further configured to provide the value responsive to the complementary clock signal being active, if the two more significant adjacent bits and the immediately adjacent less significant bit have the same value.

10. The apparatus of claim 9, wherein the majority circuit comprises:

a logic NOR gate configured to receive the complementary bits of the two adjacent more significant bits relative to the bit and the complementary bit of the adjacent less significant bit relative to the bit, configured to perform a logic NOR operation of the received bits and further configured to provide a result of the logic NOR operation as the first intermediate signal; and a logic NAND gate configured to receive the complementary bits of the two adjacent more significant bits relative to the bit and the complementary bit of the adjacent less significant bit relative to the bit, configured to perform a logic NAND operation of the received bits and further configured to provide a result of the logic NAND operation as the second intermediate signal.

11. The apparatus of claim 10, wherein the overwrite latch comprises:

a tri-state inverter configured to receive one of the immediately adjacent bits and further configured to provide a complementary signal of the one of the immediately adjacent bits responsive to the clock signal being active;

a logic circuit configured to receive the first and second intermediate signals and the bit, and further configured to provide a complementary value of the value as an output signal when the two adjacent more significant bits and the immediately adjacent less significant bit have the same value and further configured to provide a complementary bit of the bit as the output signal when any bit of the two adjacent more significant bits and the immediately adjacent less significant bit has a different value from the other adjacent bits, responsive to the complementary clock signal being active; and a logic NAND gate configured to receive either the complementary signal of the one of the immediately adjacent bits from the tri-state inverter or the output signal from the logic circuit, wherein the logic NAND gate is further configured to provide the one of the immediately adjacent bits as the bit, responsive to the clock signal being active, wherein the logic NAND gate is further configured to provide the value as the bit when the two adjacent more significant bits and the immediately adjacent less significant bit have the same value responsive to the complementary clock signal being active, and wherein the logic NAND gate is further configured to provide the bit when any bit of the two adjacent more significant bits and the immediately adjacent less significant bit has a different value from the other adjacent bits, responsive to the complementary clock signal being active.

12. The apparatus of claim 10, wherein the majority circuit further comprises:
an inverter configured to receive the result of the logic NOR operation and further configured to provide an inversion of the result as the first intermediate signal; and
a logic NOR gate configured to receive a reset signal and the result of the logic NAND operation, configured to perform a logic NOR operation of the reset signal and the result of the logic NAND operation, and further configured to provide a result of the logic NOR operation of the reset signal and the result of the logic NAND operation as the second intermediate signal.

13. The apparatus of claim 12, wherein the overwrite latch comprises:
a tri-state inverter configured to receive one of the immediately adjacent bits and further configured to provide a complementary signal of the one of the immediately adjacent bits responsive to the clock signal being active;
a first logic circuit configured to receive the bit and a set signal, and further configured to provide a result of a logic OR operation of the set signal or the bit as an output signal responsive to the complementary clock signal being active; and
a second logic circuit configured to receive the first and second intermediate signals and further configured to receive either the complementary signal of the one of the immediately adjacent bits from the tri-state inverter or the output signal from the first logic circuit,
wherein the second logic circuit is further configured to provide the one of the immediately adjacent bits as the bit, responsive to the clock signal being active,
wherein the second logic circuit is further configured to provide the value as the bit when the two adjacent more significant bits and the immediately adjacent less significant bit have the same value responsive to the complementary clock signal being active, and
wherein the second logic circuit is further configured to provide the bit when any bit of the two adjacent more significant bits and the immediately adjacent less significant bit has a different value from the other adjacent bits, responsive to the complementary clock signal being active.

14. The apparatus of claim 9, wherein the shift register further comprises:
a selector configured to receive complementary bits of the immediately adjacent bits and a shift direction control signal, and further configured to provide one of the complementary bits of the immediately adjacent bits responsive to the shift direction control signal; and
a shift latch configured to receive the one of the complementary bits of the immediately adjacent bits and further configured to provide one of the immediately adjacent bits responsive to the clock signal being active.

15. The apparatus of claim 9, wherein the shift register is configured to provide the bit further responsive to another adjacent bit that is adjacent to the immediately adjacent less significant bit relative to the bit in the thermometer code,
wherein the shift register is configured to provide a predetermined value responsive to the signal being inactive, if a majority of the two adjacent more significant bits and the two adjacent less significant bits have the predetermined value, and
wherein the majority circuit is further configured to receive the two adjacent more significant bits and the two adjacent less significant bits and further configured to provide the first and second intermediate signals.

16. A method, comprising:
providing a bit of a thermometer code responsive; at least, to a shift direction signal; and
adjusting an amount of a delay responsive to the thermometer code,
wherein providing the bit comprises:
correcting the bit using one or more adjacent more significant bits relative to the bit in the thermometer code and one or more adjacent less significant bits relative to the bit in the thermometer code.

17. The method of claim 16, wherein correcting the bit comprises:
setting a value to the bit if two adjacent bits including an immediately adjacent more significant bit relative to the bit in the thermometer code and an immediately adjacent less significant bit relative to the bit have the value.

18. The method of claim 16, wherein correcting the bit comprises:
setting a value to the bit if a majority of two adjacent bits including an immediately, adjacent more significant bit relative to the bit in the thermometer code and two adjacent less significant bits including an immediately adjacent less significant bit relative to the bit have the value.

19. The method of claim 16, further comprising:
providing one of the immediately adjacent bits as the bit based on the shift direction signal while a clock signal is in a first state; and
providing the corrected bit while the clock signal is in a second state different from the first state.

20. The method of claim 19, wherein the thermometer code represents a natural number including one or more most significant bits having the first value and zero or more least significant bits having the second value.

21. A method, comprising:
correcting a bit value of a bit included in a thermometer code that further includes more significant bits relative to the bit and less significant bits relative to the bit, wherein the bit value of the bit is corrected based on at least one more significant bit and at least one less significant bit;
providing the thermometer code including the bit with a corrected bit value to an adjustable delay line; and
adjusting a delay of the adjustable delay line based on the thermometer code.

22. The method of claim 21, wherein correcting the bit value of the bit comprises:
setting the bit value to a value responsive to immediately adjacent more significant bits and an immediately adjacent less significant bit having the value.

23. The method of claim 21, wherein correcting the bit value comprises:

setting a value to the bit if a majority of two adjacent more significant bits relative to the bit in the thermometer code and two adjacent less significant bits relative to the bit have the value.

24. The method of claim 21, wherein providing the bit of the thermometer code is repeated until the thermometer code represents a natural number including one or more highest bits having the first value and zero or more lowest bits having the second value.

25. The method of claim 21, wherein correcting the bit value comprises:
setting a predetermined value to the bit if two adjacent less significant bits relative to the bit in the thermometer code have the predetermined value.

* * * * *

UNITED STATES PATENT AND TRADEMARK OFFICE
CERTIFICATE OF CORRECTION

| | | |
|---|---|---|
| PATENT NO. | : 11,139,019 B1 | Page 1 of 1 |
| APPLICATION NO. | : 17/177025 | |
| DATED | : October 5, 2021 | |
| INVENTOR(S) | : Satoh | |

It is certified that error appears in the above-identified patent and that said Letters Patent is hereby corrected as shown below:

In the Claims

| | Reads | Should Read |
|---|---|---|
| Column 19, Line 1 | "a third shift register to provide a third bit of thermometer code" | -- a third shift register configured to provide a third bit of the thermometer code -- |

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*